United States Patent
Yu et al.

(10) Patent No.: US 9,058,897 B2
(45) Date of Patent: Jun. 16, 2015

(54) SEMICONDUCTOR MEMORY DEVICE STORING MEMORY CHARACTERISTIC INFORMATION, MEMORY MODULE AND MEMORY SYSTEM HAVING THE SAME, AND OPERATING METHOD THEREOF

(71) Applicants: Hak-Soo Yu, Seongnam-Si (KR);
Joo-Sun Choi, Yongin-Si (KR);
Hong-Sun Hwan, Suwon-Si (KR)

(72) Inventors: Hak-Soo Yu, Seongnam-Si (KR);
Joo-Sun Choi, Yongin-Si (KR);
Hong-Sun Hwan, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 234 days.

(21) Appl. No.: 13/670,065

(22) Filed: Nov. 6, 2012

(65) Prior Publication Data
US 2013/0170274 A1    Jul. 4, 2013

(30) Foreign Application Priority Data
Dec. 30, 2011 (KR) .......................... 10-2011-0147415

(51) Int. Cl.
*G11C 5/02* (2006.01)
*G11C 11/4063* (2006.01)
*G11C 14/00* (2006.01)
*G11C 16/06* (2006.01)
*G11C 11/406* (2006.01)

(52) U.S. Cl.
CPC ............ *G11C 11/4063* (2013.01); *G11C 14/00* (2013.01); *G11C 16/06* (2013.01); *G11C 11/406* (2013.01); *G11C 2211/4061* (2013.01)

(58) Field of Classification Search
USPC .................................. 365/51, 230.06, 230.01
See application file for complete search history.

(56) References Cited

U.S. PATENT DOCUMENTS

| | | | |
|---|---|---|---|
| 6,496,400 B2 * | 12/2002 | Chevallier | 365/51 |
| 6,977,857 B2 | 12/2005 | Mori et al. | |
| 7,136,978 B2 * | 11/2006 | Miura et al. | 711/165 |
| 7,260,011 B2 | 8/2007 | Riho et al. | |
| 7,916,542 B2 * | 3/2011 | Park et al. | 365/185.12 |
| 8,422,263 B2 * | 4/2013 | Saito et al. | 365/63 |
| 8,605,504 B2 * | 12/2013 | Okamoto | 365/185.09 |
| 2003/0090937 A1 * | 5/2003 | Chen | 365/185.08 |
| 2004/0068604 A1 | 4/2004 | Le et al. | |

FOREIGN PATENT DOCUMENTS

JP        09-147554    6/1997

* cited by examiner

*Primary Examiner* — Pho M Luu
(74) *Attorney, Agent, or Firm* — Volentine & Whitt, PLLC

(57) ABSTRACT

A semiconductor memory device includes a cell array including a plurality of regions accessed by first addresses, where the plurality of regions including at least two groups of regions having respectively different memory characteristics. The device further includes a nonvolatile array for nonvolatile storage of group information indicative of which of the least two groups each of the plurality of regions belongs.

30 Claims, 28 Drawing Sheets

| | PPA | 0 | 1 | 2 | 3 | 4 | 5 | 6 | 7 |
|---|---|---|---|---|---|---|---|---|---|
| Measured Refresh Period ($T_{mref}$) | | 2ms | 5ms | 1s | 24ms | 61ms | 140ms | 1ms | 128ms |
| Minimim Required Refresh Period ($T_{rref} = T_{mref}/2$) | | 1ms | 2.5ms | 0.5s | 12ms | 31ms | 70ms | 0.5ms | 64ms |
| Refresh Mapping Group ($T_{ref}$) | | 1ms | 1ms | 64ms | 8ms | 8ms | 64ms | Repair (64ms) | 64ms |

FIG. 3B

| Trref range | Group name |
|---|---|
| 1ms ≤ x < 8ms | 1ms |
| 8ms ≤ x < 32ms | 8ms |
| 32ms ≤ x < 64ms | 32ms |
| 64ms ≤ x | 64ms |

| LPA | PPA |
|---|---|
| 0 0 0 0 0 0 0 0 0 0 | 0 0 0 0 0 0 0 0 1 0 |
| 0 0 0 0 0 0 0 0 0 1 | 0 0 0 0 0 0 0 1 0 1 |
| 0 0 0 0 0 0 0 0 1 0 | 0 0 0 0 0 0 0 1 1 1 |
| • | • |
| • | • |
| • | • |
| 1 1 1 1 1 1 1 1 1 1 | 0 0 0 0 0 0 0 0 0 0 |

Fail Page Removed / Over access page Switched

SEMICONDUCTOR MEMORY DEVICE STORING MEMORY CHARACTERISTIC INFORMATION, MEMORY MODULE AND MEMORY SYSTEM HAVING THE SAME, AND OPERATING METHOD THEREOF

CROSS-REFERENCE TO RELATED APPLICATIONS

A claim of priority is made to Korean Patent Application No. 10-2011-0147415, filed on Dec. 30, 2011, in the Korean Intellectual Property Office, the disclosure of which is incorporated herein in its entirety by reference.

BACKGROUND

The inventive concepts generally relate to semiconductor memory devices, and more particularly, the inventive concepts relate to semiconductor memory devices which stores memory characteristic information, to memory modules and memory systems including the same, and to methods of operation the same.

A Dynamic Random Access Memory (DRAM) is an example of a semiconductor memory device having a finite data retention characteristic. That is, even for a non-defective memory cell, the validity of data stored in the memory cell is not guaranteed after the lapse of a specified time period. As such, refresh functionality is adopted in which the DRAM refreshes (rewrites) data stored in the memory cell at the expiration of each refresh period. The refresh period is set as a specification value of the DRAM.

Refresh periods may be reduced (i.e., refresh frequency may be increased) as device integration is increased. This is because, for example, the size (capacitance) of memory cell capacitors can decrease, and the adverse effects of parasitic capacitances and the like can increase, as the DRAM becomes more highly integrated.

In the meantime, a weak cell (i.e., a cell with an unacceptably low data retention characteristic) may be replaced with a redundancy cell of the semiconductor memory device. However, the efficiency of this approach is limited since the redundancy cell may have the same or similar memory characteristics as the so-called weak cell, particularly as device integration is increased. It may thus be necessary to devote considerable resources to the provision of redundancy cells.

SUMMARY

According to an aspect of the inventive concepts, there is provided a semiconductor memory device which includes a cell array including a plurality of regions accessed by first addresses, where the plurality of regions including at least two groups of regions having respectively different memory characteristics. The device further includes a nonvolatile array for nonvolatile storage of group information indicative of which of the least two groups each of the plurality of regions belongs.

According to another aspect of the inventive concepts, there is provided a semiconductor memory device which includes a cell array including a plurality of regions, and a nonvolatile array for nonvolatile storage of conversion information for conversion of first addresses denoting physical addresses of the plurality of regions to second addresses based on memory characteristics of the plurality of regions. The device further includes a decoder for accessing the nonvolatile array in response to a signal from an external device.

According to another aspect of the inventive concepts, there is provided a memory module includes a module board, and at least one memory chip, which is assembled on the module board and includes a cell array having a plurality of regions, the plurality of regions including at least two groups of regions having respectively different memory characteristics. The module further includes a memory management chip, which is assembled on the module board, manages a memory operation of the at least one memory chip, and comprises a nonvolatile array for nonvolatile storage of group information indicative of which of the least two groups each of the plurality of regions belongs.

According to another aspect of the inventive concepts, there is provided a memory controller is for communicating with a semiconductor memory device including a cell array having a plurality of regions, the plurality of regions including at least two groups of regions having respectively different memory characteristics. The memory controller includes an address converter for receiving group information indicative of which of the at least two groups each of the plurality of region belongs, and converting a first address indicative of a physical address of each of the plurality of regions to a second address based on the group information. The controller further includes an address storing unit for storing conversion information for the conversion of addresses.

According to another aspect of the inventive concepts, there is provided a memory controller is for communicating with a semiconductor memory device including a cell array having a plurality of regions. The memory controller includes an address storing unit for storing conversion information for conversion of first addresses indicating physical addresses of the plurality of regions to second addresses based on memory characteristics of the plurality of regions. The controller further includes a decoder for receiving a second address from a host and accessing the address storing unit by decoding the second address, where a first address corresponding to the second address from the host is output to the semiconductor memory device.

BRIEF DESCRIPTION OF THE DRAWINGS

Exemplary embodiments of the inventive concepts will become readily apparent from the detailed description that follows, taken in conjunction with the accompanying drawings, in which:

FIGS. 3A and 3B are diagrams for use in describing the grouping of regions of a cell array based on memory characteristics, according to an embodiment of the inventive concepts;

DETAILED DESCRIPTION OF THE EMBODIMENTS

Embodiments of the inventive concepts will now be described with reference to the accompanying drawings with the intention of providing a clear understanding of the inventive concepts to those of ordinary skill in the art, but without the intention of limiting the scope of the claims appended hereto.

As used herein, the term "and/or" includes any and all combinations of one or more of the associated listed items. Expressions such as "at least one of," when preceding a list of elements, modify the entire list of elements and do not modify the individual elements of the list.

Figure 1:
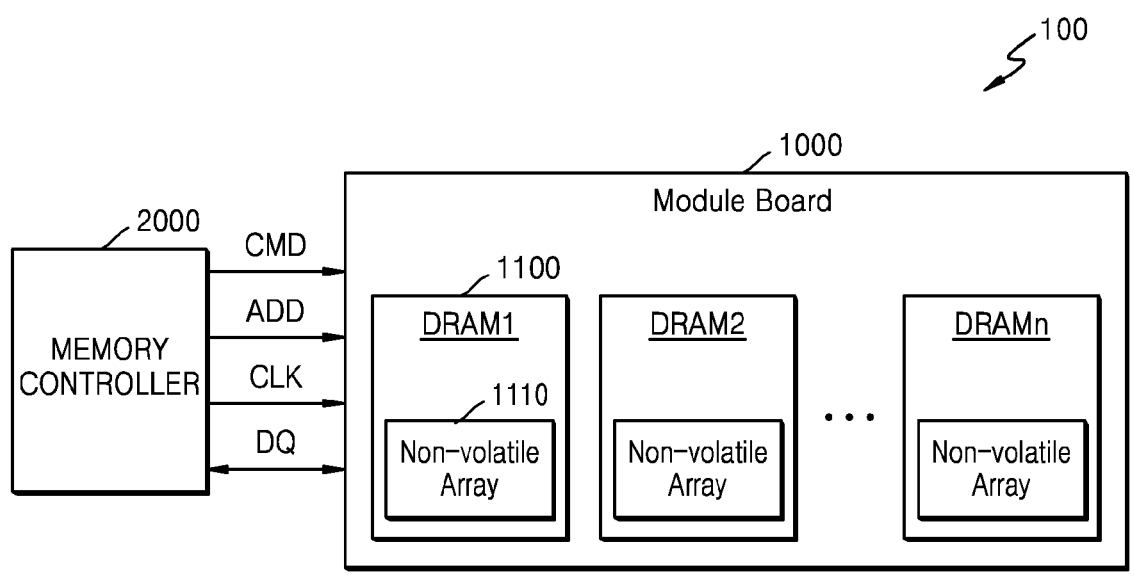
FIG. 1 is a block diagram of a memory system to which the inventive concepts may be applied.

FIG. 1 is a block diagram of a memory system 100 to which the inventive concepts may be applied. As shown in FIG. 1, the memory system 100 includes a memory module 1000 and a memory controller 2000. The memory module 1000 includes at least one semiconductor memory device 1100 assembled on a module board. Each semiconductor memory device 1100 may be, for example, a volatile memory chip including an array of volatile memory cells (not shown in FIG. 1). Hereinafter, the example is presented in which each semiconductor memory device 1100 is a DRAM chip including an array of DRAM memory cells. However, the inventive concepts are not limited thereto.

The memory controller 2000 transmits various kinds of signals, e.g., command/address signals CMD/ADD and a clock signal CLK, for controlling the semiconductor memory device 1100 of the memory module 1000, and transmits and/or receives a data signal DQ to and/or from the semiconductor memory device 1100 by communicating with the memory module 1000. As mentioned above, the embodiments present the example where the semiconductor memory device 1100 includes a DRAM cell array. The DRAM cell array may be divided into a plurality of regions. For example, the cell array may include a plurality of memory banks, each memory bank including a plurality of pages. A page may be defined as a unit for storing data moving from a bank to a bitline sense amplifier when one RAS (row address strobe) active command is applied.

In addition to the DRAM cell array, according to the example of this embodiment, each semiconductor memory device 1100 further includes a nonvolatile storage unit. The nonvolatile storage unit may be implemented in any of a variety of different forms. For example, the nonvolatile storage unit may implemented by an nonvolatile array 1110 in which fuses and anti-fuses are arranged in an array to store data in a nonvolatile manner.

According to the example of the present embodiment, information associated with a memory characteristic of the DRAM cell array is stored in the nonvolatile array 1110. For example, information associated with a data retention characteristic of each region of the DRAM cell array may be stored in the nonvolatile array 1110. As another example, a data retention characteristic of each of a plurality of regions (e.g., pages) of the DRAM cell array may be tested, and a test result may be stored in the nonvolatile array 1110.

In addition, a Physical Page Address (PPA) of each of the pages may be converted to a Logical Page Address (LPA) by referring to data retention characteristics of the pages. This address conversion operation may be performed by one-to-one mapping of the PPA and the LPA. In addition, when the address conversion operation is performed, the mapping may be performed so that at least some bits of the LPA include a data retention characteristic of a corresponding page. In a memory operation, the memory controller 2000 may determine memory characteristics (e.g., data retention characteristics) of the pages by referring to bit information of the LPA and manage the memory operation in consideration of a characteristic of each page depending upon a result of the determination. As an example of the memory operation, by considering the data retention characteristics of the cell array, a refresh operation may be managed on a page basis, or an access operation including read/write may be managed on a page basis.

Figure 2:
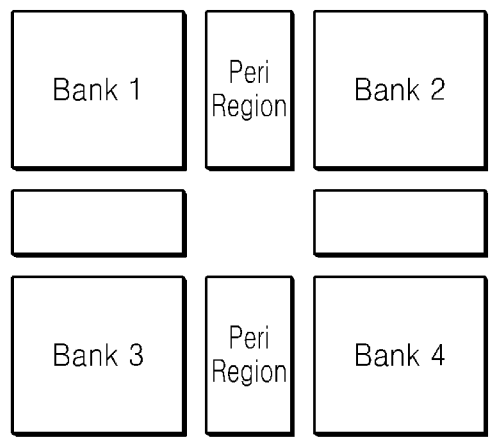
FIGS. 2A and 2B are diagrams representing bank and page structures of a semiconductor memory device of the memory system of FIG. 1, according to an embodiment of the inventive concepts.
Figure 2:
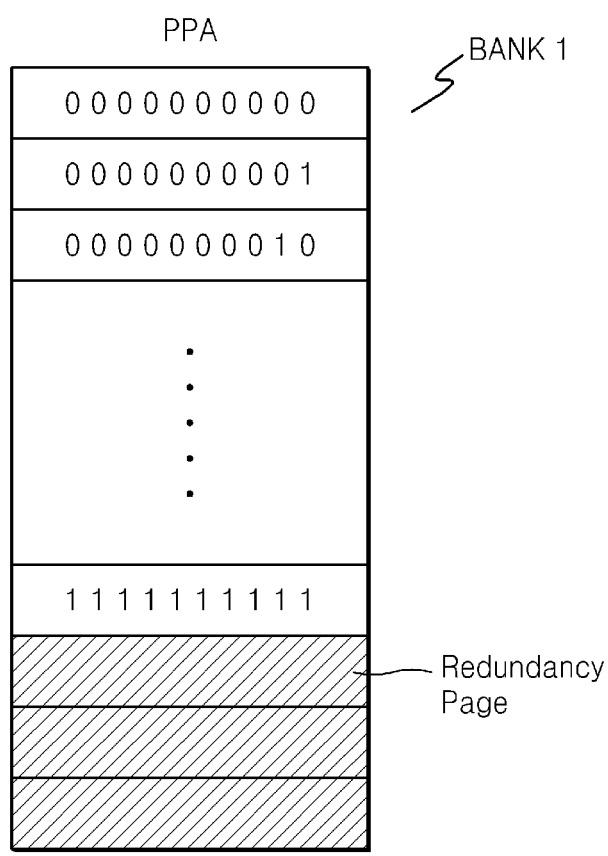

FIGS. 2A and 2B are diagrams for explaining a bank structure and a page structure of the semiconductor memory device 1100 of FIG. 1, according to an embodiment of the inventive concepts. As shown in FIG. 2A, the semiconductor memory device 1100 may include a cell array including first to fourth memory banks BANK1 to BANK4 and peri regions for driving the cell array. Although not shown, various circuits, such as a row decoder, a column decoder, a data input/output unit, a refresh management unit, may be arranged in the peri regions to drive the cell array, and the nonvolatile array 1110 shown in FIG. 1 may be further included in the semiconductor memory device 1100.

Each of the first to fourth memory banks BANK1 to BANK4 may include a plurality of pages. For example, as shown in FIG. 2B, a certain bank (e.g., the first bank BANK1) may include a plurality of pages of which PPAs are respectively designated as "0000000000" to "1111111111". In addition, the certain bank may include at least one redundancy page for use in repairing one or more pages having a defective portion. Each of the pages may store a predetermined amount of data (e.g., 8 k-byte data), and when one RAS (Row Address Strobe) active command is applied, a corresponding page is selected in response to an external address (e.g., a row address), and data of the selected page moves to a bitline sense amplifier (not shown), thereby performing a data sensing operation.

FIGS. 3A and 3B are diagrams for describing an operation of grouping regions of a cell array based on memory characteristics, according to an embodiment of the inventive concepts. To determine characteristics of the cell array, a plurality of regions of the cell array may be tested, and regions having the same or similar characteristics may be grouped. For example, each of the data retention characteristics of a plurality of pages of the cell array may be tested, and group information indicating to which group a data retention characteristic of each page belongs may be generated depending on a test result.

That is, the data retention characteristics of the plurality of pages may be tested, and the group to which a data retention characteristic of each page belongs may be determined based on the test results. For example, as shown in FIG. 3A, when actual data retention values Tmref of pages at PPAs 0 to 7 are measured as 2 ms, 5 ms, 1 s, 24 ms, 61 ms, 140 ms, 1 ms, and 128 ms, respectively, refresh periods Trref required for the pages with respect to a retention guard band may be calculated as 1 ms, 2.5 ms, 0.5 s, 12 ms, 31 ms, 70 ms, 0.5 ms, and 64 ms, respectively. FIG. 3A shows an example in which the refresh periods Trref based on the retention guard band are half the actual data retention values Tmref, respectively.

In addition, a plurality of groups Tref may be defined based on the measured refresh periods Trref. For example, as shown in FIG. 3B, the plurality of groups Tref may be classified into a first group in which a range of refresh periods Trref is equal to or greater than 1 ms and less than 8 ms (group name: 1 ms), a second group in which a range of refresh periods Trref is equal to or greater than 8 ms and less than 32 ms (group name: 8 ms), a third group in which a range of refresh periods Trref is equal to or greater than 32 ms and less than 64 ms (group name: 32 ms), and a fourth group in which a range of refresh periods Trref is equal to or greater than 64 ms (group name: 64 ms). Accordingly, pages of which PPAs correspond to 0 and 1 belong to the first group, pages of which PPAs correspond to 3 and 4 belong to the second group, and the other PPAs belong to the fourth group. Memory characteristic information of the pages that may be determined as described above (e.g., information regarding groups to which the pages belong) is stored in the nonvolatile array 1110 of the semiconductor memory device 1100. The number of groups may be limited to a predetermined number. Also, for example, the information regarding groups to which the pages belong (hereinafter, group information) may have a two-bit length when 4 groups are defined.

In the above described embodiment, the number of defined groups may be determined based on a distribution of memory characteristics, such as data retention, and may be changed depending on an application to which the semiconductor memory device 1100 is applied. In addition, a boundary for defining each group may be determined in consideration of a test guard band, and a basic unit forming each group may be defined in in a variety of different ways. For example, although it has been described in FIGS. 3A and 3B that a page is a unit for forming each group, a page cluster binding several pages may be a unit for forming each group. In addition, when a plurality of pages are classified into groups, a classification operation may be performed using pages included in memory banks of a cell array or using pages included in memory blocks corresponding to a portion of the memory banks.

Alternatively, the classification operation may be performed after a bad page is replaced by a redundancy page. For example, as shown in FIGS. 3A and 3B, a page of which a PPA corresponds to 6 may be a bad page of which a refresh period Trref corresponds to 0.5 ms, and the bad page may be repaired via replacement with a redundancy page. When memory characteristics are classified, the classification operation may be performed based on memory characteristics of repaired pages.

Figure 4A:
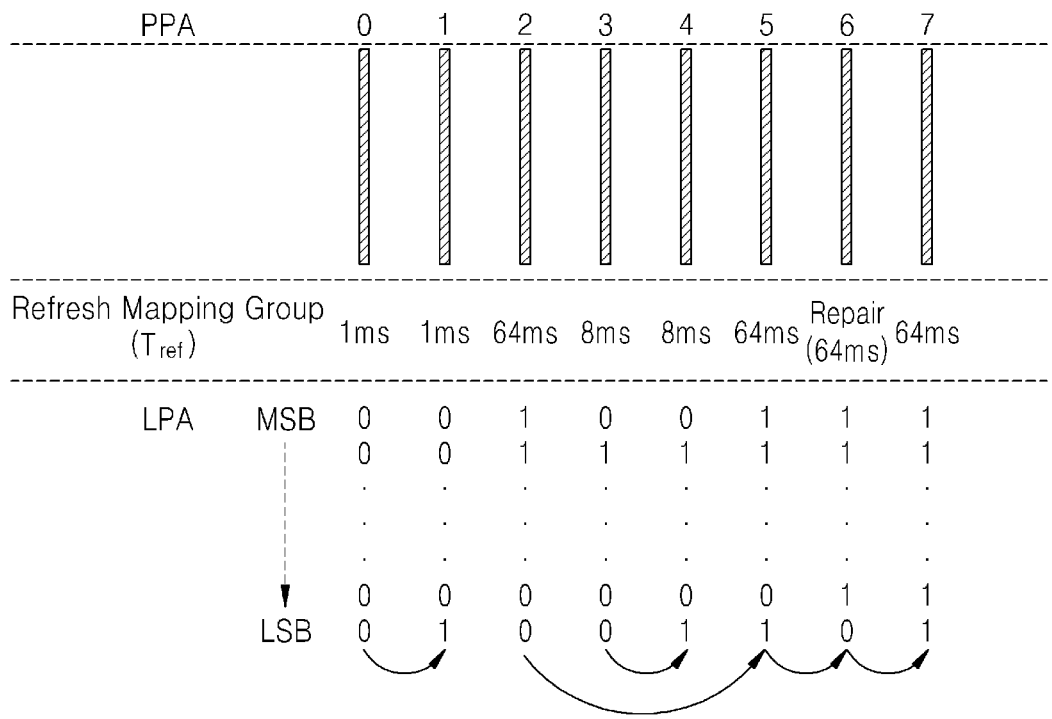
FIGS. 4A and 4B are diagrams for use in describing an address conversion operation using characteristic information of FIGS. 3A and 3B, according to an embodiment of the inventive concepts.
Figure 4B:
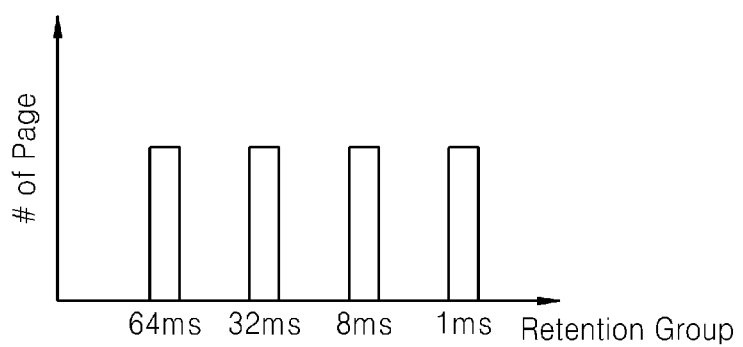

FIGS. 4A and 4B illustrate an address conversion operation using characteristic information of FIGS. 3A and 3B, according to an embodiment of the inventive concepts. PPAs of pages allocated to each group in FIGS. 3A and 3B are converted to LPAs, and at least one bit of an LPA includes memory characteristic information. For example, when data retention characteristics of pages are classified into 4 groups, two bits of each LPA may include group information. FIG. 4A shows an example in which two Most Significant Bits (MSBs) of each LPA include group information, and FIG. 4B shows an example in which group information of "00", "01", "10", and "11" is allocation to the first group (group name: 1 ms), the second group (group name: 8 ms), the third group (group name: 32 ms), the fourth group (group name: 64 ms), respectively. That is, a data retention characteristic of each page may be determined from at least one bit of a corresponding LPA, and the influence of a weak cell (or page) may be minimized by managing an operation of the semiconductor memory device 1100 in consideration of the determined characteristic.

The operation of grouping memory characteristic information or the operation of converting PPAs to LPAs may be variously implemented. For example, as shown in FIG. 4B, memory characteristic information may be grouped so that a size of each group is the same. That is, the grouping may be performed so that the number of pages belonging to each group is the same, and to do this, when the number of pages belonging to a certain group exceeds a number allocated to the group, the grouping may be performed so that the excess pages are allocated to another group.

For example, in a semiconductor memory device manufacturing process, characteristics of partial cells (or partial pages) of a cell array may decrease, and in this case, the number of partial cells (or partial pages) having lower characteristics than normal cells (or normal pages) is relatively small. Accordingly, normal pages are allocated to the fourth group (group name: 64 ms), and pages exceeding a number allocated to the fourth group (group name: 64 ms) are allocated to the third group (group name 32 ms) as a next group. In this way, the same number of pages may be allocated to each group, and accordingly, to a group having relatively low data retention characteristics, pages having data retention characteristics corresponding to the group and pages having better data retention characteristics may be allocated together.

After the group allocation operation, the operation of converting PPAs to LPAs may be performed. Some bits (e.g., two MSBs) of each of the LPAs are set to a specific value in correspondence with each group, and each value of the LPAs of pages belonging to each group may be obtained by counting a corresponding LPA from the Least Significant Bit (LSB) one-by-one.

The address conversion operation may be performed by a test operation of the semiconductor memory device 1100. Alternately, the address conversion operation may be performed by a memory controller or host by referring to characteristic information of pages stored in the semiconductor memory device 1100 in a nonvolatile manner. When the address conversion operation is performed by the test operation, address conversion information between PPAs and LPAs is stored in the semiconductor memory device 1100 in a nonvolatile manner. When the address conversion operation is performed by the memory controller or host, the memory controller or host reads the characteristic information of pages stored in the semiconductor memory device 1100 and performs the address conversion operation using the read characteristic information. In addition, the memory controller or host may store the address conversion information between PPAs and LPAs according to the address conversion operation in its internal storage (e.g., a volatile storage such as Static Random Access Memory (SRAM)). For example, when a data access request is transmitted from the host to the memory controller, the memory controller checks at least some bits of an LPA to determine a memory characteristic of a page to be accessed and provides a PPA corresponding to the LPA of the page to be accessed to the semiconductor memory device 1100 to perform a data access operation.

Figure 5A:
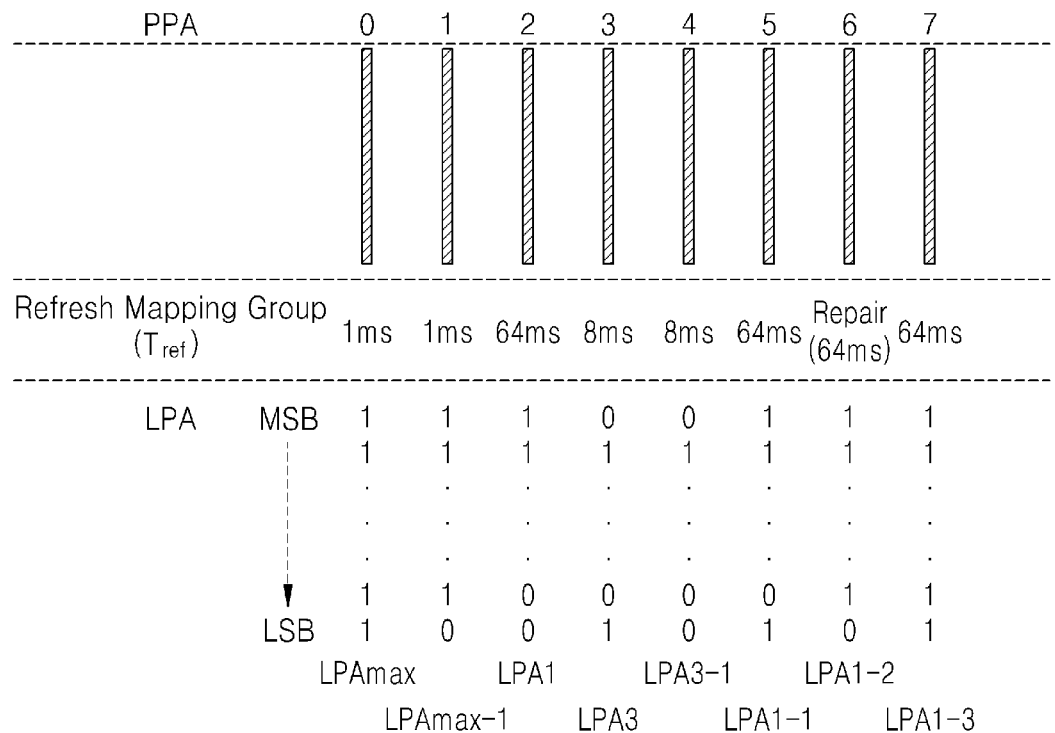
FIGS. 5A and 5B are diagrams for use in describing an address conversion operation using the characteristic information of FIGS. 3A and 3B, according to another embodiment of the inventive concepts.
Figure 5B:
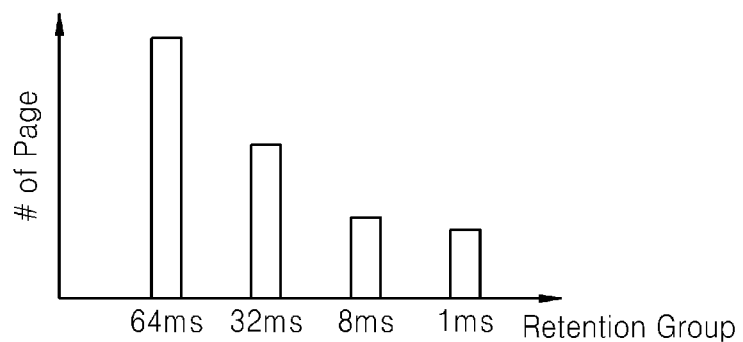

FIGS. 5A and 5B illustrate an address conversion operation using the characteristic information of FIGS. 3A and 3B, according to another embodiment of the inventive concepts. FIGS. 5A and 5B also show an example in which data retention characteristics of pages are classified into 4 groups, and PPAs are converted to LPAs depending on a group classification result.

When the grouping is performed based on memory characteristics of the pages, the groups may be set having different sizes (or, numbers of pages). For example, as shown in FIG. 5B, the number of pages belonging to the fourth group (group name 64 ms) may be greatest while the number of pages belonging to the first group (group name 1 ms) may be least. That is, the group sizes are defined to be suitable for the number of pages corresponding to each group, and after the grouping is completed, the address conversion operation may be performed.

PPAs of pages allocated to each group are converted to LPAs, and memory characteristic information is determined by referring to each LPA. As shown in FIG. 5A, when grouping is performed based on a data retention characteristic of each page, each page may be allocated to one of a plurality of groups according to a test result of a data retention characteristic of the page. When information regarding pages belonging to each group and a size of each group are determined by the allocation operation, the PPAs are converted to the LPAs. This address conversion operation may be performed by up-counting or down-counting each of the LPAs of each group. For example, since each group size has already been determined, LPAs of pages of the first group (group name: 1 ms) may be allocated by a down-counting operation from the maximum value LPAmax "1111111111", and LPAs of pages of the fourth group (group name: 64 ms) may be allocated by a down-counting operation from a predetermined address value LPA1 to the minimum value "0000000000".

That is, LPAs of the same number as the number of pages allocated to each group are allocated to each corresponding group. FIG. 5A shows an example in which the LPAs of the pages of the first group (group name: 1 ms) have relatively large address values. However, values of LPAs allocated to each group may be allocated differently from the example shown in FIG. 5A. When memory characteristics (e.g., data retention characteristics) of pages are determined using address values of LPAs, a memory characteristic of each page may be determined by checking a range in which an address value of each LPA is located.

A generation/storing operation of the group information and address conversion information described above will now be described. For convenience of description, it is assumed that a region of a cell array as a unit of the grouping is a page, and a memory characteristic to be tested is a data retention characteristic of each page.

Figure 6:
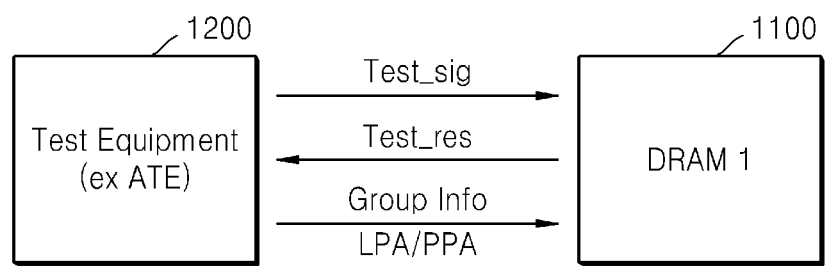
FIG. 6 is a block diagram of a memory device interfacing with test equipment, according to an embodiment of the inventive concepts.

FIG. 6 is a block diagram by which memory characteristics of a memory device are determined by test equipment, according to an embodiment of the inventive concepts. FIG. 6 shows an example in which the semiconductor memory device 1100 is tested by an external Automated Test Equipment (ATE) 1200.

To obtain memory characteristic information of a plurality of pages of a cell array included in the semiconductor memory device 1100, the ATE 1200 transmits various kinds of test signals Test_sig to the semiconductor memory device 1100. The various kinds of test signals Test_sig may include a command, an address, and a data signal for accessing the plurality of pages of the cell array. The ATE 1200 receives a test result Test_res from the semiconductor memory device 1100. By a test operation, a data signal from the ATE 1200 may be stored in the cell array, and read data obtained by reading the data signal stored in the cell array may be provided to the ATE 1200 as the test result Test_res.

The ATE 1200 determines memory characteristics of the plurality of pages of the cell array by analyzing the test result Test_res. The ATE 1200 determines data retention characteristics of the plurality of pages as the memory characteristics, classifies the plurality of pages into at least two groups based on a result of the determination, and generates group information Group Info based on a result of the classification. In addition, the ATE 1200 converts a PPA of each of the plurality of pages to an LPA by using the group information Group Info to generate address conversion information LPA/PPA. An operation of generating the group information Group Info and the address conversion information LPA/PPA may be performed according to the embodiments described with reference to FIGS. 3A to 5B. For example, the address conversion operation may be performed by determining the group information Group Info of the plurality of pages and one-to-one mapping the LPAs and the PPAs.

The ATE 1200 provides the group information Group Info and/or the address conversion information LPA/PPA to the semiconductor memory device 1100. The semiconductor memory device 1100 stores the group information Group Info and/or the address conversion information LPA/PPA in a nonvolatile array (not shown) included therein.

Figure 7:
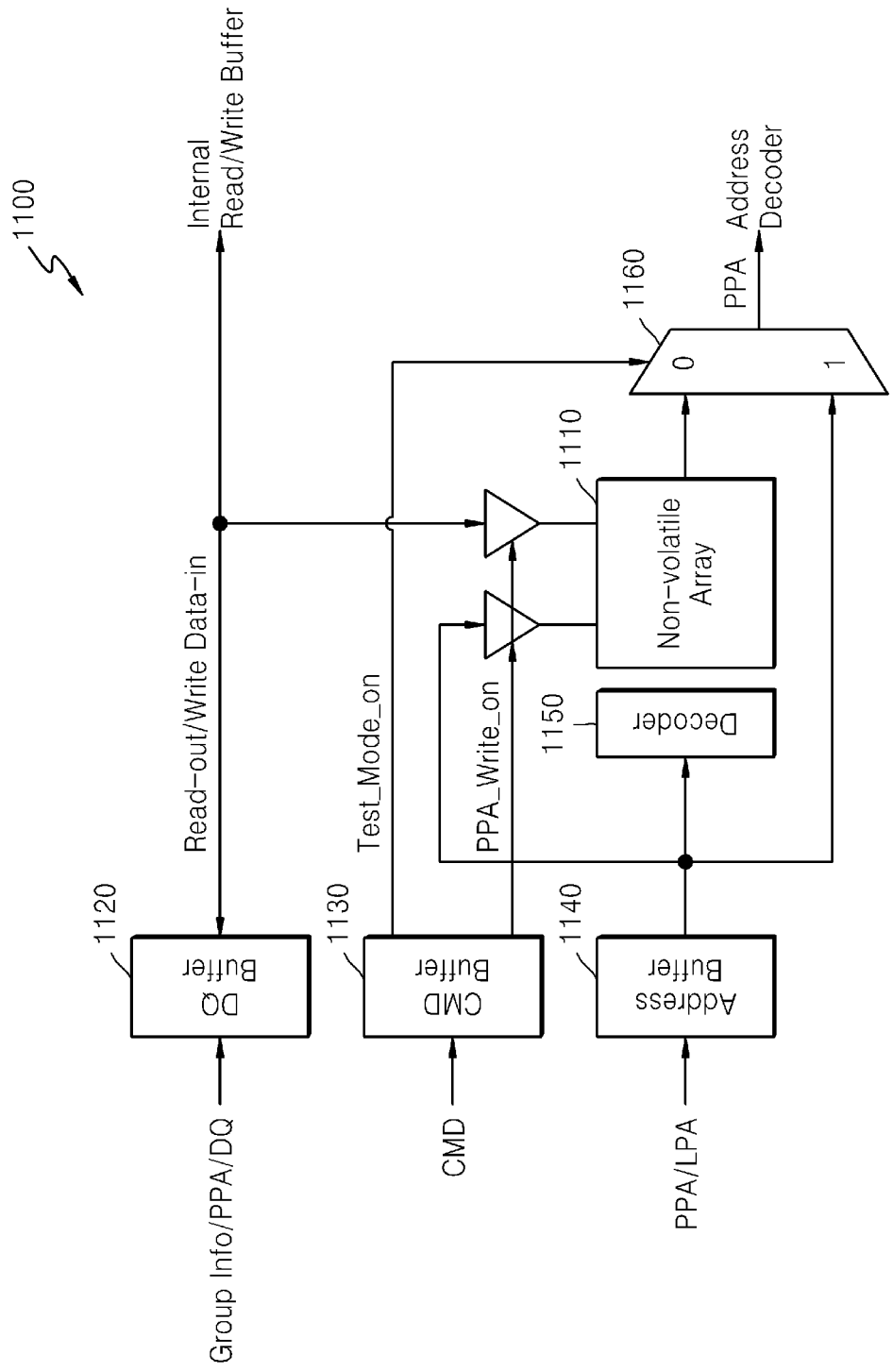
FIG. 7 is a block diagram by which group information and/or address conversion information are stored in the semiconductor memory device, according to an embodiment of the inventive concepts.

FIG. 7 is a block diagram by which the group information Group Info and/or the address conversion information LPA/PPA are stored in the semiconductor memory device 1100, according to an embodiment of the inventive concepts. FIG. 7 shows an example in which the group information Group Info and/or the address conversion information LPA/PPA generated by a test equipment are stored in the nonvolatile array 1110 included in the semiconductor memory device 1100.

As shown in FIG. 7, the semiconductor memory device 1100 may include the nonvolatile array 1110, a data buffer 1120, a command buffer 1130, an address buffer 1140, a decoder 1150, and a multiplexer 1160. The nonvolatile array 1110 may include a storage region for storing the group information Group Info and a storage region for storing the address conversion information LPA/PPA.

The group information Group Info and the address conversion information LPA/PPA from the test equipment may be stored in the corresponding regions of the nonvolatile array 1110. Alternatively, only the address conversion information LPA/PPA from the test equipment may be stored in the nonvolatile array 1110. When the address conversion information LPA/PPA is stored, an LPA is used to access the nonvolatile array 1110, and a corresponding PPA may be stored at a location designated by the LPA. That is, an operation of storing the address conversion information LPA/PPA may be performed by substantially storing the PPA in the nonvolatile array 1110.

Thereafter, the LPA is input to the semiconductor memory device 1100 for a memory operation, and the PPA stored in the nonvolatile array 1110 is output by decoding the LPA. The PPA is provided to an address decoder for accessing the cell array.

The data buffer 1120 temporarily stores a data signal DQ in a normal mode and temporarily stores a data signal DQ for a test or group information Group Info or a PPA to be stored in the nonvolatile array 1110 in a test mode. The group information Group Info or the PPA is provided to the nonvolatile array 1110 via one or more buffers.

The command buffer 1130 receives various kinds of commands CMD for operating the semiconductor memory device 1100 in the normal mode or the test mode. In the test mode, the semiconductor memory device 1100 enters into a test mode Test_Mode_On as dictated by a command CMD, and a data signal DQ and a PPA for the test operation are provided to the semiconductor memory device 1100. In the test mode Test_Mode_On, the multiplexer 1160 selectively outputs an externally received PPA. A data signal DQ accessed based on the PPA is provided to the test equipment, and the test equipment generates group information Group Info or address conversion information LPA/PPA of pages of a cell array (not shown). The entering into the test mode Test_Mode_On may be controlled by combining existing specific commands CMD or a separate pin included in the semiconductor memory device 1100.

The semiconductor memory device 1100 enters into a mode PPA_Write_On for storing group information Group Info and/or address conversion information LPA/PPA by a command CMD. Group information Group Info is stored in a predetermined region of the nonvolatile array 1110 via the data buffer 1120.

To store address conversion information LPA/PPA in the nonvolatile array 1110, a PPA and an LPA are provided to the semiconductor memory device 1100. For example, the PPA is provided to the nonvolatile array 1110 via the data buffer 1120, and the LPA is provided to the decoder 1150 via the address buffer 1140. The PPA is stored in a region corresponding to the LPA in the nonvolatile array 1110.

Thereafter, an LPA for accessing the cell array in a normal operation of the semiconductor memory device 1100 is externally received, and the nonvolatile array 1110 outputs a PPA stored in a region corresponding to the LPA. In the normal mode, the multiplexer 1160 selectively outputs a PPA from the nonvolatile array 1110 and provides the PPA to the address decoder.

An example has been presented herein in which only PPAs are substantially stored in the nonvolatile array 1110 when address conversion information LPA/PPA is stored in the nonvolatile array 1110. However, the inventive concepts are not limited thereto. For example, a mapping table having mapping information between PPAs and LPAs may be stored in the semiconductor memory device 1100, and a corresponding PPA may be output by referring to the mapping table and an externally provided LPA.

Figure 8:
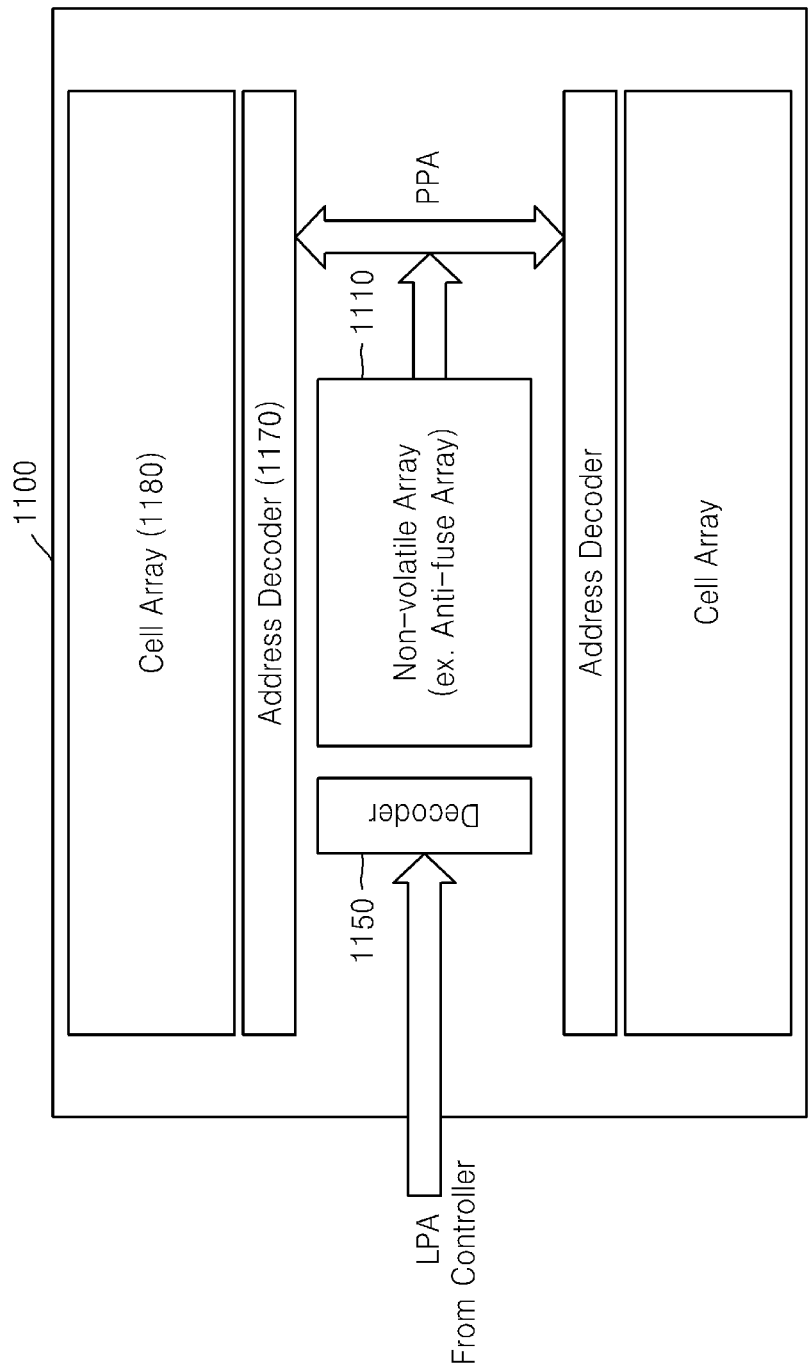
FIG. 8 is a block diagram illustrating an operation of the semiconductor memory device in a normal mode, according to an embodiment of the inventive concepts.

FIG. 8 is a block diagram illustrating an operation of the semiconductor memory device 1100 in the normal mode, according to an embodiment of the inventive concepts. As shown in FIG. 8, the semiconductor memory device 1100 includes the nonvolatile array 1110, which stores address conversion information LPA/PPA between LPAs and PPAs. For a memory operation, an LPA is received from an external controller, and the LPA is provided to the nonvolatile array 1110 via the decoder 1150. A PPA stored in a region corresponding to the LPA is output from the nonvolatile array 1110 and is provided to a cell array 1180 via an address decoder 1170. Although FIG. 8 shows an example in which an antifuse array is used to implement the nonvolatile array 1110, the nonvolatile array 1110 may instead, for example, be implemented using a fuse array. In addition, the nonvolatile array 1110 may be implemented using a laser fuse array for permanently storing information or an electric fuse array in which information may be updated.

Examples have been presented herein in which group information Group Info and/or address conversion information LPA/PPA are stored in the nonvolatile array 1110 of the semiconductor memory device 1100. However, the group information Group Info and/or the address conversion information LPA/PPA may instead be stored in a separate chip on the memory module 1000. That is, a result obtained by testing characteristics of the semiconductor memory device 1100 assembled on the memory module 1000 may be stored in a separate management chip on the memory module 1000, and a memory operation control based on memory characteristics may be performed by an external controller or the management chip on the memory module 1000. In addition, embodiments of the inventive concepts may be applied to various type of memory modules, such as a Single In-line Memory Module (SIMM), a Dual In-line Memory Module (DIMM), a Small-Outline DIMM (SO-DIMM), an Unbuffered DIMM (UDIMM), a Fully-Buffered DIMM (FBDIMM), a Rank-Buffered DIMM (RBDIMM), a Load-Reduced DIMM (LRDIMM), a mini-DIMM, and a micro-DIMM.

Figure 9A:
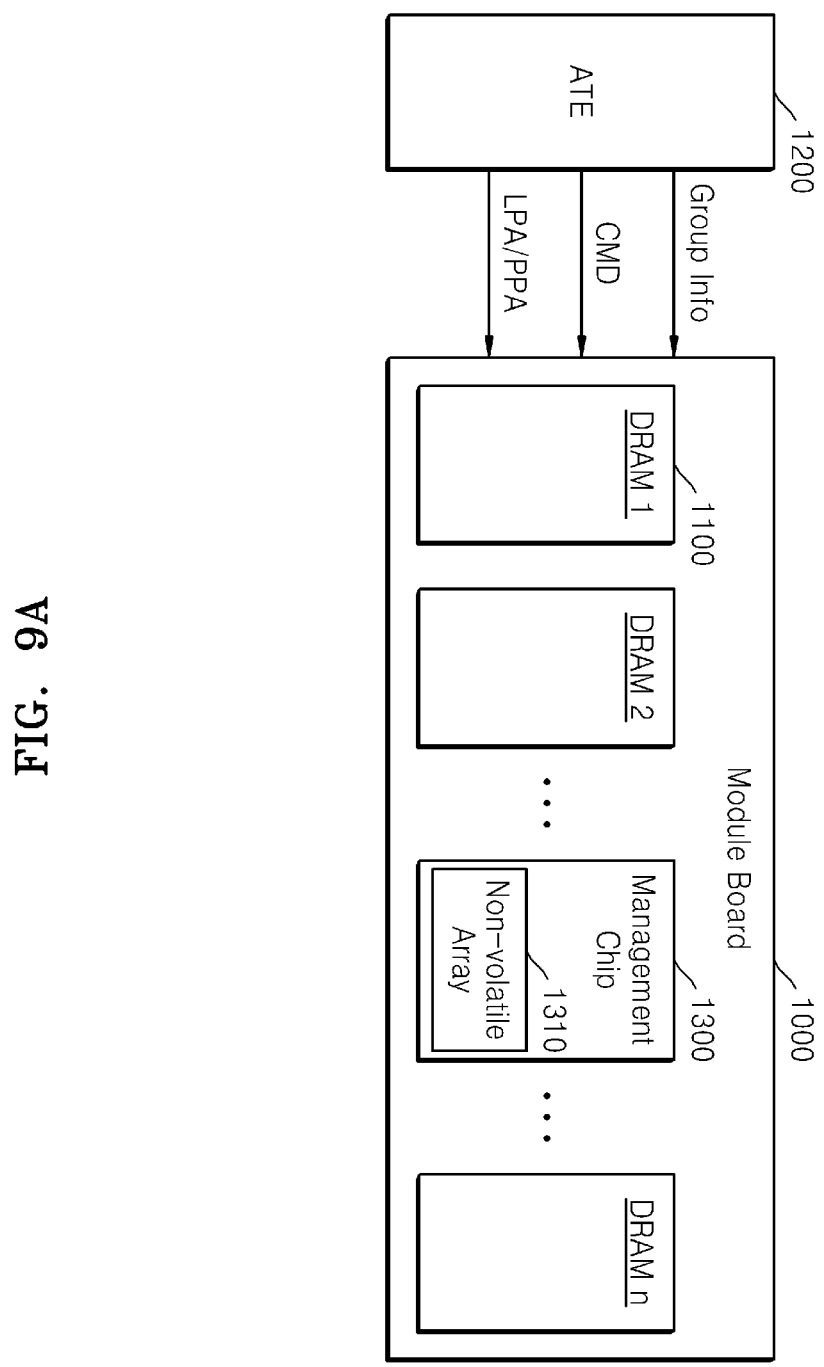
FIGS. 9A and 9B are block diagrams of a memory module according to an embodiment of the inventive concepts.
Figure 9B:
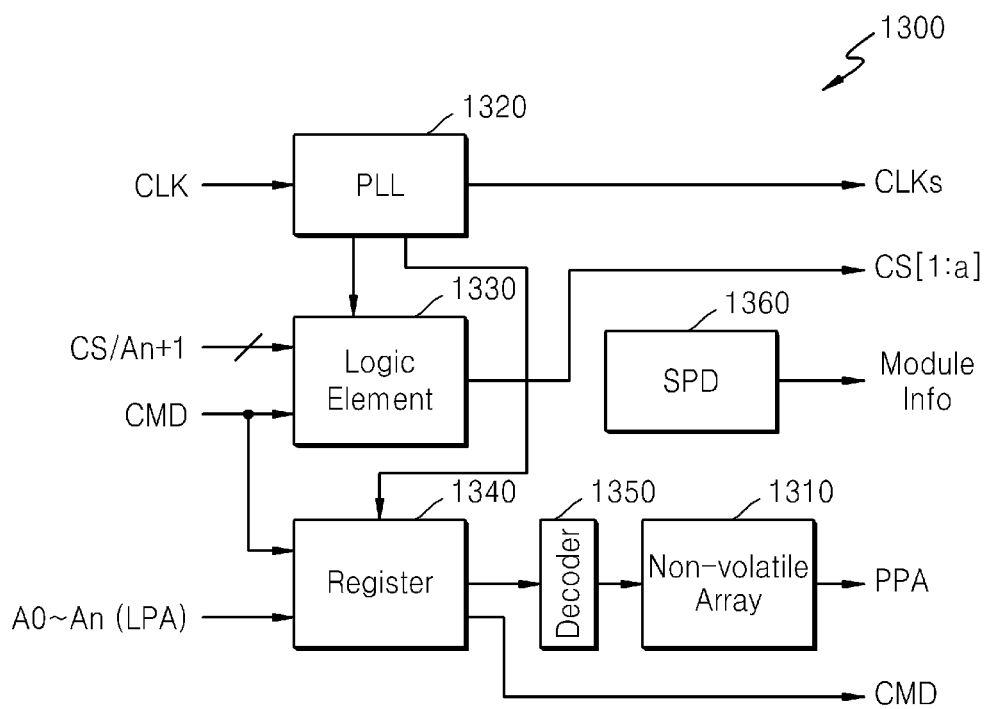

FIGS. 9A and 9B are block diagrams of the memory module 1000 according to an embodiment of the inventive concepts. FIGS. 9A and 9B show an example in which the current embodiment is applied to an LRDIMM-type memory module.

As shown in FIG. 9A, the memory module 1000 may include one or more semiconductor memory devices 1100 and a memory management chip 1300 assembled on a module board. DRAM chips DRAM1 to DRAMn, each DRAM chip having a DRAM cell, may be applied as the semiconductor memory devices 1100, and the memory management chip 1300 includes a nonvolatile array 1310 for storing group information Group Info and/or address conversion information LPA/PPA associated with characteristics of a cell array (not shown) of the semiconductor memory devices 1100. For the LRDIMM-type memory module, one or more ranks for a memory operation are defined. For example, the DRAM chips DRAM1 to DRAMn may be defined as respective ranks.

Group information Group Info and/or address conversion information LPA/PPA as a test result of the ATE 1200 are stored in the nonvolatile array 1310 of the memory management chip 1300. A command CMD for an operation in the test mode or an information storing mode is provided to the semiconductor memory devices 1100, and the group information Group Info to be stored in the nonvolatile array 1310 provided to the memory management chip 1300. In addition, to store the address conversion information LPA/PPA, PPAs and LPAs are provided to the memory management chip 1300. As described above, an LPA is used as an address to select a storing location in the nonvolatile array 1310, and a corresponding PPA is stored at the location selected based on the LPA.

FIG. 9B is a block diagram of an implemented example of the memory management chip 1300. In the LRDIMM-type memory module 1000, two or more semiconductor memory devices 1100 are grouped to a single logical chip. The memory management chip 1300 includes a logic element 1330 for generating one or more control signals to control ranks of the semiconductor memory devices 1100. In addition, the memory management chip 1300 may include a Phase Locked Loop (PLL) 1320 for adjusting a phase by receiving an externally supplied clock signal CLK, a register 1340 for temporarily storing a command CMD and an address A0 to An that are externally supplied, a decoder 1350 for accessing the nonvolatile array 1310, and a Serial-Presence Detect (SPD) 1360 for storing module information.

The logic element 1330 receives a command CMD, a chip select signal CS, and at least one upper address bit An+1 and generates control signals CS[1:a] for controlling ranks by processing the received signals. The rank control signals CS[1:a] are generated in correspondence with the number of ranks of the memory module 1000. The number of rank control signals CS[1:a] may be the same as the number of ranks included in the memory module 1000. An external memory controller (not shown) recognizes that a smaller number of ranks than the ranks actually included in the memory module 1000 are included in the memory module 1000. For example, the memory module 1000 includes n ranks, and the memory controller recognizes that n/2 ranks are included in the memory module 1000. The logic element 1330 selects a rank based on the chip select signal CS, the upper address bit An+1, and the command CMD.

The SPD 1360 may include a nonvolatile memory (e.g., Electrically Erasable Programmable Read Only Memory (EEPROM)). For example, when a memory interface is designed, information (e.g., the number of row and column addresses, a data width, the number of ranks, memory density per rank, the number of semiconductor memory devices, and memory density per semiconductor memory device) associated with the semiconductor memory devices 1100 assembled on the memory module 1000 is recorded in the SPD 1360. When the memory system 100 is initialized, information Module_info associated with the memory module 1000 is provided from the SPD 1360 to the memory controller.

To access a cell array included in a selected DRAM chip (or rank), the address A0 to An is received from the memory controller, and the address A0 to An has an LPA. The LPA is provided to the nonvolatile array 1310 via the decoder 1350. A PPA stored in a corresponding region of the nonvolatile array 1310 is output according to a result of decoding the LPA.

Figure 10A:
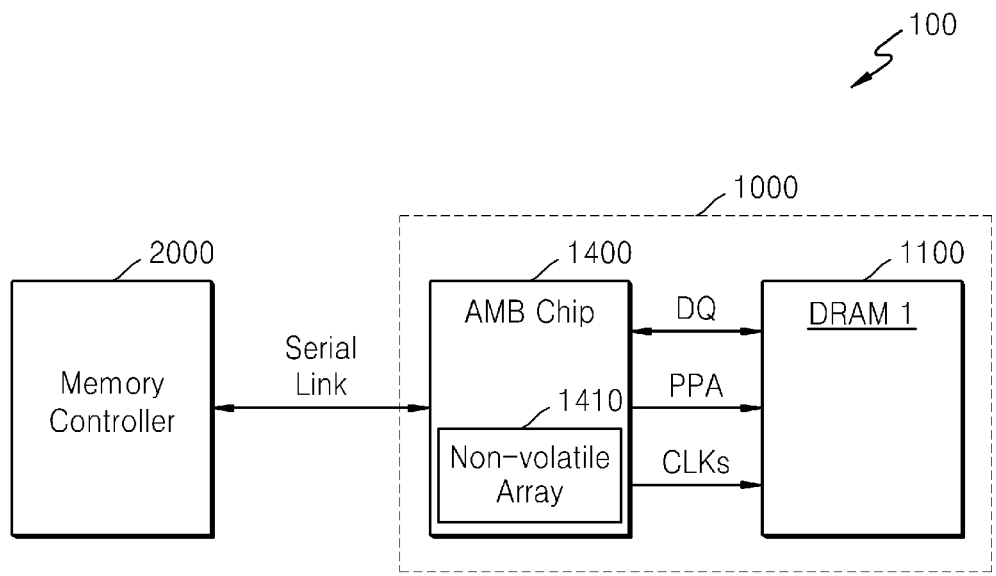
FIGS. 10A and 10B are block diagrams of a memory module and a memory system according to another embodiment of the inventive concepts.
Figure 10B:
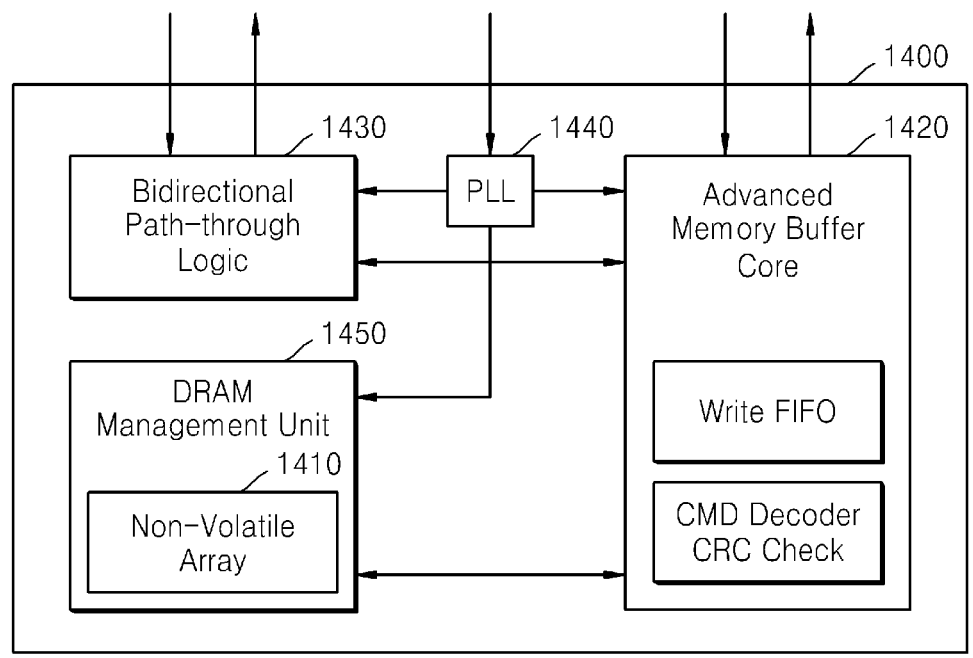

FIGS. 10A and 10B are block diagrams of the memory module 1000 and the memory system 100 according to another embodiment of the inventive concepts. FIGS. 10A and 10B show an example in which the current embodiment is applied to an FBDIMM-type memory module.

As shown in FIG. 10A, the memory system 100 includes the memory module 1000 and the memory controller 2000. The memory module 1000 includes at least one semiconductor memory device 1100 and an Advanced Memory Buffer (AMB) chip 1400. The FBDIMM-type memory module 1000 performs serial communication with the memory controller 2000 via the AMB chip 1400 connecting to the memory controller 2000 in a point-to-point scheme. Although FIG. 10A shows only one memory module 1000 for convenience of description, since the number of memory modules 1000 connected to the memory system 100 may increase according to an FBDIMM method, a relatively large memory capacity may be possible, and since the FBDIMM method uses a packet protocol, a relatively high speed operation may be possible.

The AMB chip 1400 includes a nonvolatile array 1410 for storing information regarding memory characteristics of the semiconductor memory device 1100 of the memory module 1000. Group information and/or address conversion information generated based on a result obtained by testing a cell array included in the semiconductor memory device 1100 of the memory modules 1000 as described above may be stored in the nonvolatile array 1410 as the information regarding memory characteristics. A signal communicated in serial between the memory controller 2000 and the AMB chip 1400 includes an LPA. The AMB chip 1400 converts the LPA to a PPA based on the address conversion information stored in the nonvolatile array 1410 and outputs a data signal DQ, the PPA, and a clock signal CLKs for a memory operation to the semiconductor memory device 1100.

FIG. 10B is a block diagram of an implementation example of the AMB chip 1400. As shown in FIG. 10B, the AMB chip 1400 includes a PLL 1440 for receiving an externally supplied clock signal, and generating a clock signal used in the AMB chip 1400, an AMB core 1420 for receiving/strogin an externally supplied packet and decoding a command CMD or performing a Cyclic Redundancy Check (CRC) for checking whether the packet is damaged, and a path control logic 1430 for controlling a bidirectional transfer of the packet. In addition, the AMB chip 1400 further includes a DRAM management unit 1450 for managing a memory operation based on the memory characteristics of the cell array of the semiconductor memory device 1100, and the DRAM management unit 1450 may include the nonvolatile array 1410 for storing group information and/or address conversion information.

The DRAM management unit 1450 converts an LPA included in the externally supplied packet to a PPA based on the address conversion information stored in the nonvolatile array 1410. The PPA is provided to the semiconductor memory device 1100 via the AMB core 1420.

Figure 11A:
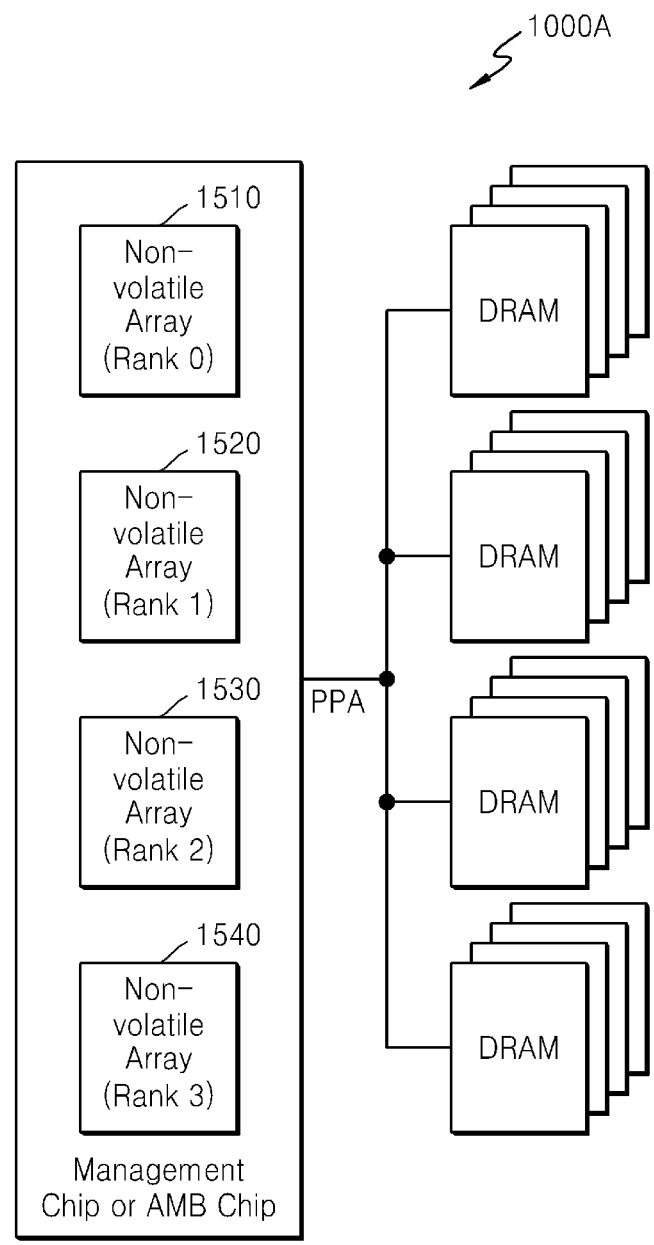
FIGS. 11A and 11B are block diagrams illustrating address conversion of a plurality of DRAM chips included in memory modules, respectively, according to an embodiment of the inventive concepts.
Figure 11B:
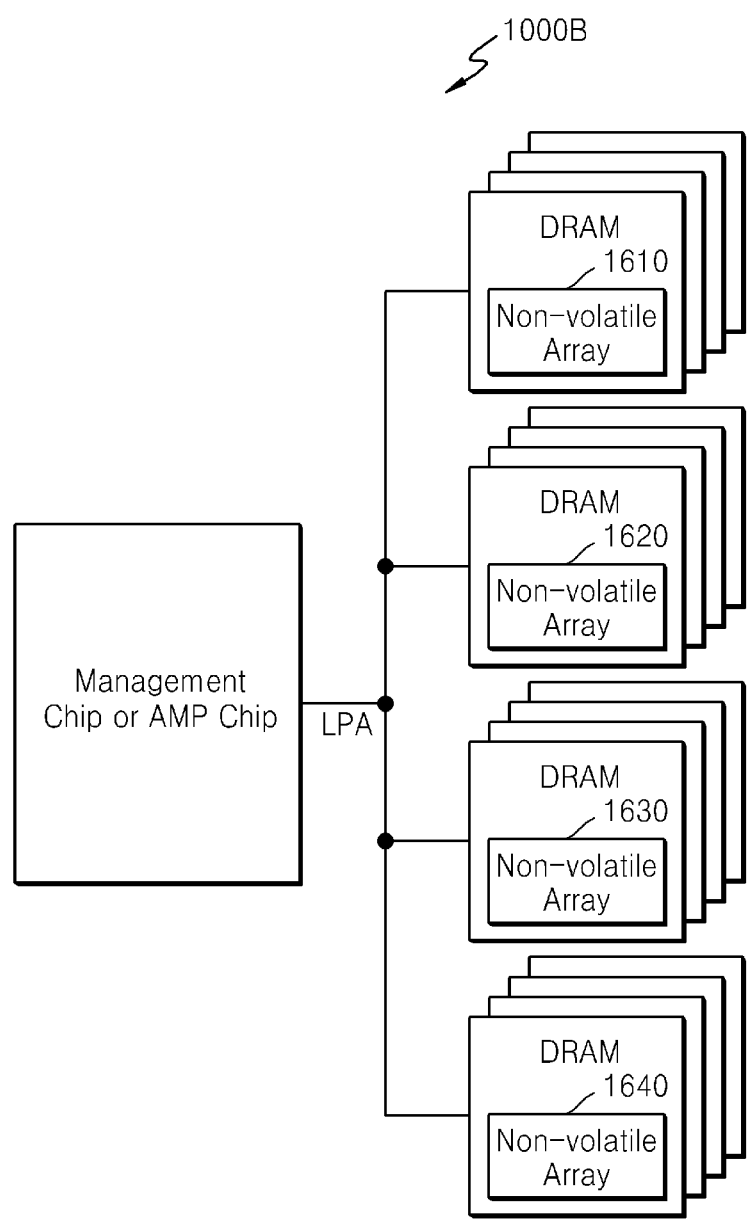

FIGS. 11A and 11B are block diagrams illustrating address conversion of a plurality of DRAM chips included in memory modules 1000A and 1000B, respectively, according to an embodiment of the inventive concepts. The memory modules 1000A and 1000B shown in FIGS. 11A and 11B may be applied to various-type of memory modules other than the LRDIMM-type memory module and the FBDIMM-type memory module described above.

As shown in FIG. 11A, the memory module 1000A may include a plurality of DRAM chips together with a memory management chip or an AMB chip. The plurality of DRAM chips of the memory module 1000A may be individually selected by a chip select signal (not shown) to perform a memory operation. Alternatively, the plurality of DRAM chips may be defined by a plurality of ranks to perform a rank select operation and a memory operation in response to the chip select signal or at least one other address signal (not shown).

The memory management chip or AMB chip (hereinafter, this chip is assumed as the memory management chip) may include first to fourth nonvolatile arrays 1510 to 1540 for storing address conversion information between LPAs and PPAs per DRAM chip or rank. For example, when the plurality of DRAM chips are classified into 4 ranks, the first to fourth nonvolatile arrays 1510 to 1540 may store address conversion information of corresponding ranks. In addition, as described above, each of the first to fourth nonvolatile arrays 1510 to 1540 may store group information based on memory characteristics of a plurality of regions of corresponding DRAM chips. Although FIG. 11A shows the first to fourth nonvolatile arrays 1510 to 1540, a single nonvolatile array for storing address conversion information of all the DRAM chips may instead be used.

The memory management chip generates a PPA for accessing a DRAM chip by using various signals which are supplied for a memory operation. For example, the memory management chip selects a nonvolatile array to perform an address conversion operation by referring to a chip select signal CS or an upper address bit An+1 from an LRDIMM-type memory module, as shown in FIGS. 9A and 9B, and converts an LPA A0 to An for selecting a region (e.g., page) of a DRAM chip to a PPA by using the selected nonvolatile array. The PPA is provided to the selected DRAM chip.

FIG. 11B shows an example in which a nonvolatile array is arranged in each DRAM chip in the memory module 1000B. Regions of a plurality of DRAM chips of the memory module 1000B have different memory characteristics, and accordingly, address conversion information of the plurality of DRAM chips are stored in corresponding nonvolatile arrays 1610 to 1640 of the plurality of DRAM chips. The memory management chip selects a DRAM chip for a memory operation by using a chip select signal and an address externally supplied, and provides an LPA to the selected DRAM chip. The LPA provided to the selected DRAM chip is converted to a PPA by a nonvolatile array of the selected DRAM chip.

Figure 12:
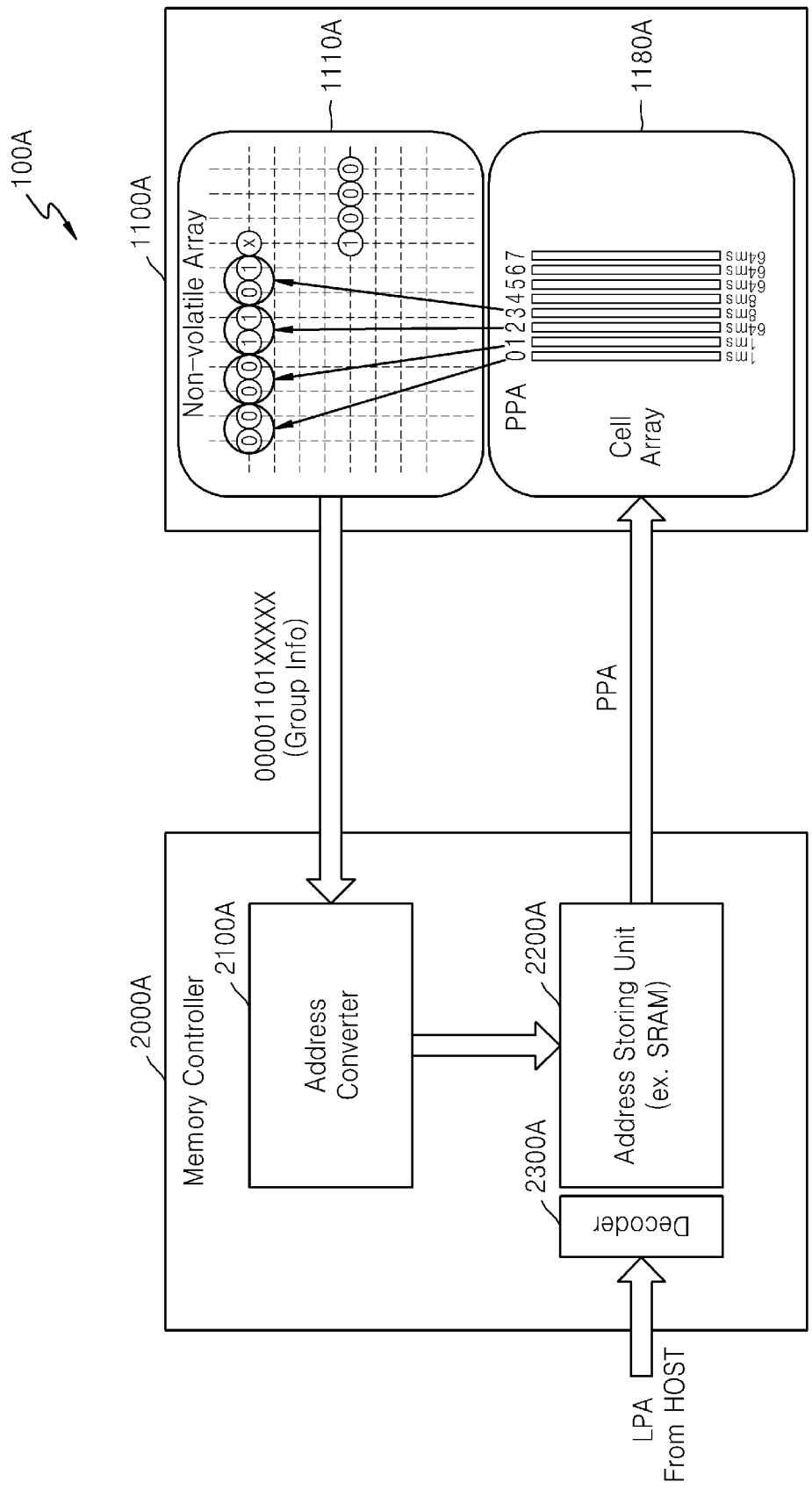
FIG. 12 is a block diagram of a memory system according to another embodiment of the inventive concepts.

FIG. 12 is a block diagram of a memory system 100A according to another embodiment of the inventive concepts. In the memory system 100A, group information Group Info obtained by testing memory characteristics of pages of a cell array 1180A is stored in a semiconductor memory device 1100A, and when the memory system 100A is operated, a memory controller 2000A performs an address conversion operation using the group information Group Info. The group information Group Info is described above as being stored in the semiconductor memory device 1100A in FIG. 12. However, the group information Group Info may instead be stored in a separate chip on a memory module (not shown).

The semiconductor memory device 1100A includes the cell array 1180A having a plurality of regions (e.g., pages) and a nonvolatile array 1110A for storing memory characteristic information of the pages of the cell array 1180A. In an operation of testing the semiconductor memory device 1100A, a memory characteristic (e.g., data retention characteristic) of each page of the cell array 1180A is tested, and the pages are classified into at least two groups based on tested memory characteristics. For example, the plurality of pages of the cell array 1180A may be classified into 4 groups based on data retention characteristics, and a group classification result is stored in the nonvolatile array 1110A.

The plurality of pages may have their own PPAs based on their physical locations in the cell array 1180A, and group information Group Info may be sequentially stored in the nonvolatile array 1110A based on values of the PPAs. For example, when four groups are defined, group information Group Info of each page may be any one of "00", "01", "10", and "11". In addition, in an increasing order of the values of the PPAs, group information Group Info of the plurality of pages may be sequentially stored in the nonvolatile array 1110A.

When the memory system 100A is operated, the group information Group Info stored in the nonvolatile array 1110A is transmitted to the memory controller 2000A in a serial transmission scheme. The memory controller 2000A determines information regarding a group to which each page of the cell array 1180A belongs by detecting the group information Group Info transmitted in serial n bits by n bits (2 bits in the case of FIG. 12). An address converter 2100A converts a PPA to an LPA based on the group information Group Info and stores corresponding address conversion information in an address storing unit 2200A. The address storing unit 2200A may store address conversion information in various formats. As described above, an LPA may be used as an address for accessing the address storing unit 2200A, and a PPA corresponding to the LPA may be stored at a corresponding location of the address storing unit 2200A.

The transmission of group information Group Info and the address conversion operation in the memory controller 2000A, which have been described above, may be performed every time the memory system 100A is operated, and accordingly, the address storing unit 2200A of the memory controller 2000A may be implemented by a volatile memory. For example, FIG. 12 shows an example in which the address storing unit 2200A is implemented by SRAM, which is a volatile memory.

Thereafter, in a normal operation of the semiconductor memory device 1100A, the memory controller 2000A receives a request for an access to the memory controller 2000A from an external host and receives an LPA for the access operation from the host. The LPA from the host is provided to the address storing unit 2200A via a decoder 2300A, and a PPA stored in a corresponding region of the address storing unit 2200A is output and provided to the semiconductor memory device 1100A. Based on the PPA, a page of the cell array 1180A is selected, and data in the selected page is accessed.

FIG. 12 shows an example in which group information Group Info is stored in the semiconductor memory device 1100A, and the memory controller 2000A performs an address conversion operation based on the group information Group Info and stores address conversion information. However, the address conversion operation based on the group information Group Info may be performed by a host, and the address conversion information may be stored in the host.

FIGS. 13A, 13B, and 13C illustrate an address conversion operation in the memory system 100A of FIG. 12, according to an embodiment of the inventive concepts. FIG. 13A shows group information Group Info stored in the semiconductor memory device 1100A in a nonvolatile manner. The group information Group Info of pages of the cell array 1180A is provided to the memory controller 2000A.

The memory controller 2000A sorts PPAs depending on a direction in which the group information Group Info increases or decreases. For example, the PPAs are sorted in a direction in which the group information Group Info decreases from "11" to "00".

Figure 13:
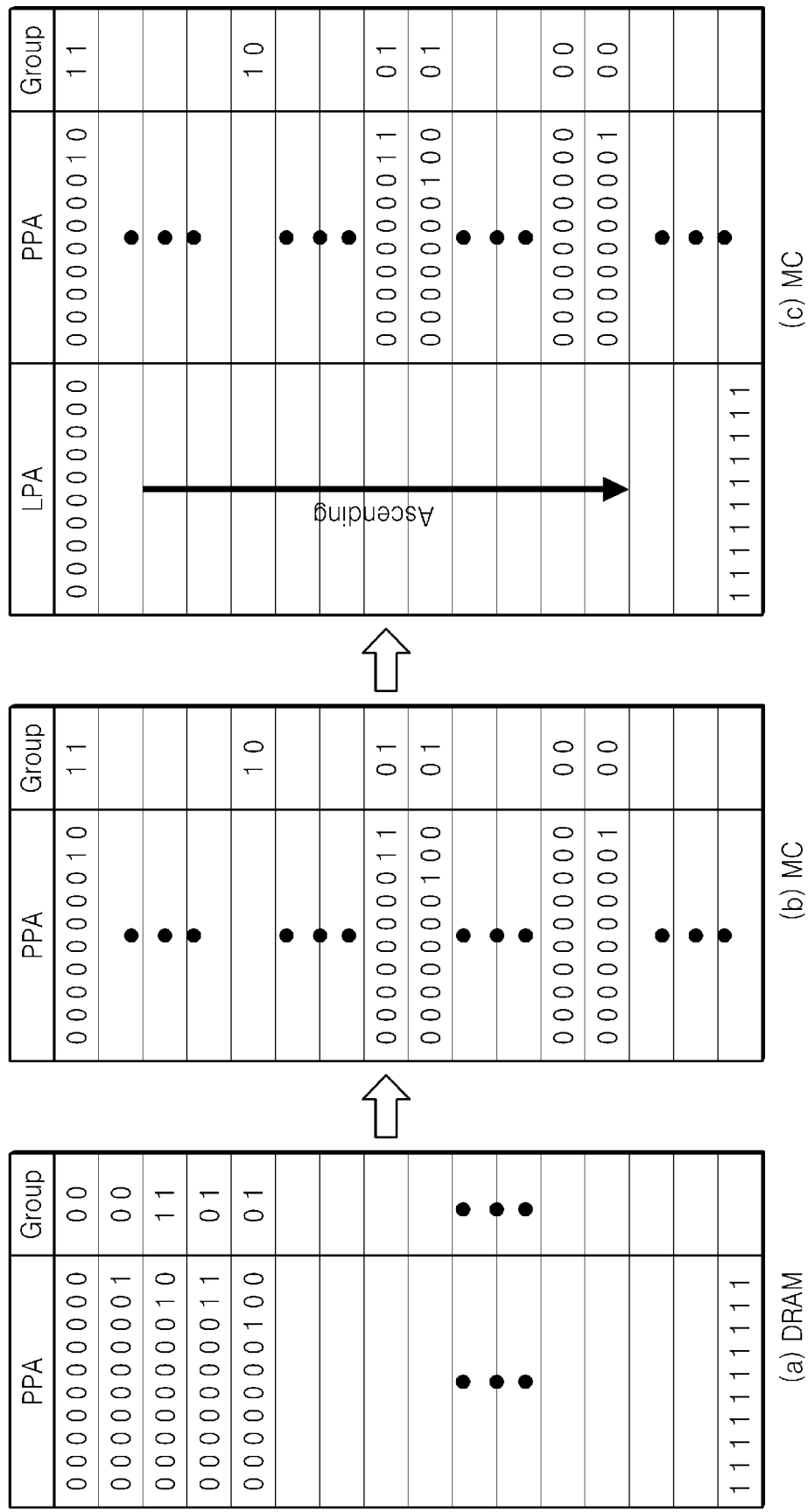
FIGS. 13A, 13B, and 13C illustrate an address conversion operation in the memory system of FIG. 12, according to an embodiment of the inventive concepts.

After the sorting operation, the memory controller 2000A performs a mapping operation, as shown in FIG. 13C. The mapping operation may be performed for the sorted PPAs by one-to-one mapping the PPAs and corresponding LPAs in a direction in which the LPAs increase or decrease. FIG. 13 shows an example in which the mapping operation is performed for the sorted PPAs in the direction in which the LPAs increase.

In the current embodiment, the PPAs are converted to the LPAs by the sorting mapping operation, and this address conversion information is stored in the address storing unit 2200A of the memory controller 2000A.

Figure 14:
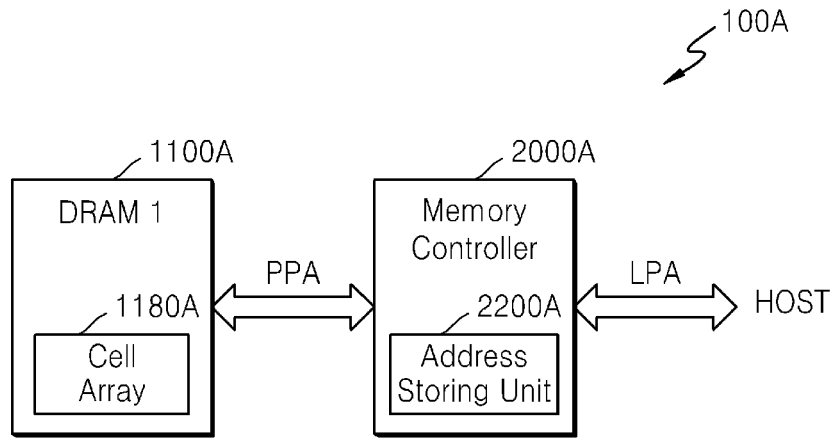
FIG. 14 is a block diagram illustrating a normal operation of a memory system, according to an embodiment of the inventive concepts.

FIG. 14 is a block diagram illustrating a normal operation of the memory system 100A, according to an embodiment of the inventive concepts. As shown in FIG. 14, an LPA is transmitted and received between a host and the memory controller 2000A. The memory controller 2000A includes the address storing unit 2200A, and the LPA from the host is converted to a PPA by the memory controller 2000A. The PPA is transmitted and received between the memory controller 2000A and the semiconductor memory device 1100A. Data of the cell array 1180A corresponding to the PPA is accessed.

Figure 15:
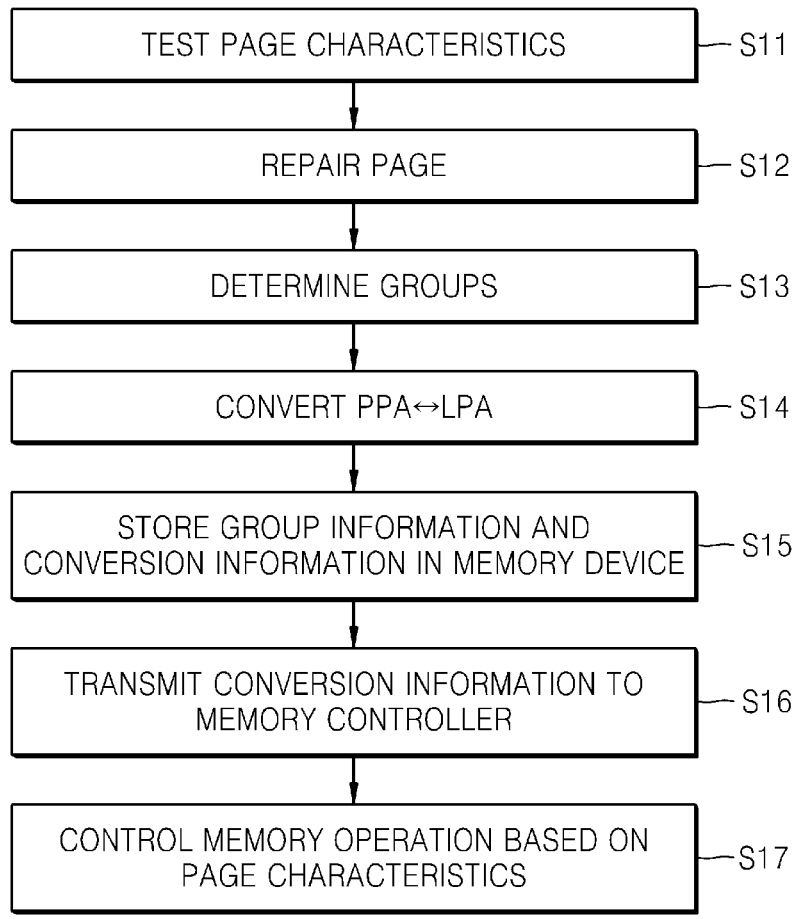
FIG. 15 is a flowchart illustrating an operating method of a memory system, according to an embodiment of the inventive concepts.

FIG. 15 is a flowchart illustrating an operating method of a memory system, according to an embodiment of the inventive concepts. FIG. 15 shows an example in which group information and address conversion information are generated by a test operation and stored in a semiconductor memory device.

As shown in FIG. 15, the semiconductor memory device is tested by external test equipment. The test operation includes testing characteristics of a plurality of pages included in a cell array of the semiconductor memory device in operation S11. The testing of the characteristics of the plurality of pages may include detecting whether a bad cell exists in each page or detecting a data retention characteristic of each page.

As a result of testing the characteristics of the plurality of pages, if a bad cell exists in some pages or a data retention characteristic exceeds an allowed range, a page repair operation is performed in operation S12. The page repair operation may be performed by replacing a page having a low characteristic with a redundancy page. After the page repair operation, the pages are classified into at least two groups based on the characteristics of the plurality of pages, and accordingly, groups to which the individual pages belong are determined in operation S13.

If group information regarding the groups to which the individual pages belong is generated, PPAs are converted to LPAs based on the group information in operation S14. As described above, this address conversion operation may be performed by sorting the PPAs based on the group information and mapping the PPAs and LPAs based on a sorting result. After the address conversion operation, the group information and address conversion information are stored in the semiconductor memory device in a nonvolatile manner in operation S15.

When the memory system, including the semiconductor memory device in which the address conversion information is stored, is operated, the address conversion information stored in the semiconductor memory device is transmitted to a memory controller in operation S16. At least one of PPA information and LPA information may be transmitted as the address conversion information. The memory controller determines memory characteristics of the plurality of pages of the cell array by detecting at least one bit of each of the LPAs or values of the LPAs. When the memory controller performs a memory operation (e.g., a refresh operation, a data read/write operation, etc.) of the semiconductor memory device, the memory controller controls the memory operation based on page characteristics by selecting an LPA to be accessed based on a memory characteristic of each page and providing the selected LPA to the semiconductor memory device in operation S17.

Figure 16:
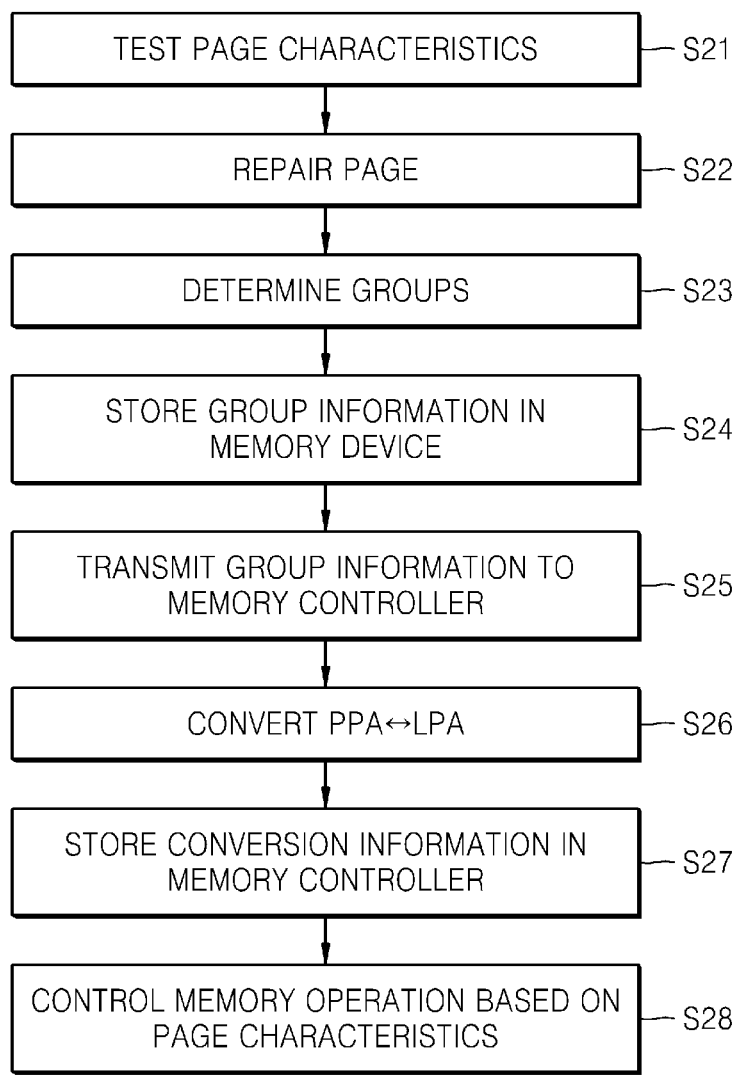
FIG. 16 is a flowchart illustrating an operating method of a memory system, according to another embodiment of the inventive concepts.

FIG. 16 is a flowchart illustrating an operating method of a memory system, according to another embodiment of the inventive concepts. An example in which group information and address conversion information are stored in a semiconductor memory device has been described in the embodiment of FIG. 15. On the other hand, an example in which address conversion information is generated by and stored in an external memory controller or host is described in the current embodiment.

As shown in FIG. 16, characteristics of a plurality of pages included in a cell array of a semiconductor memory device are tested by external test equipment in operation S21, and as a result of testing the characteristics of the plurality of pages, if a bad cell exists or a data retention characteristic exceeds an allowed range, a page repair operation is performed in operation S22. The pages are classified into at least two groups based on the memory characteristics of the plurality of pages, and accordingly, groups to which the individual pages belong are determined in operation S23. Group information according to the grouping is stored in the semiconductor memory device in a nonvolatile manner in operation S24.

When the memory system including the semiconductor memory device is operated, the group information stored in a DRAM chip is transmitted to the external memory controller or host in operation S25. The memory controller or host receives the group information and converts PPAs of the plurality of pages to LPAs based on the group information in operation S26. This address conversion information may be performed by sorting the PPAs based on the group information and mapping the PPAs and LPAs based on a sorting result, as described above. This address conversion information is stored in the memory controller or host in operation S27. The address conversion information may be stored every time the memory system is operated, and in this case, the address conversion information may be able to be stored in the memory controller or host in a volatile manner.

The memory controller or host determines memory characteristics of the plurality of pages of the cell array corresponding to the PPAs by detecting at least one bit of each of the LPAs or values of the LPAs. The memory controller or host controls a memory operation of the semiconductor memory device based on characteristics of the plurality of pages in operation S28. For example, the address conversion information is stored in the memory controller, and the host manages a memory operation, such as a refresh operation, a data read/write operation, etc., based on a data retention characteristic of each page by referring to an LPA. The host transmits and receives an LPA to and from the memory controller, and the memory controller converts the LPA to a PPA based on the address conversion information and provides the PPA to the semiconductor memory device.

Figure 17A:
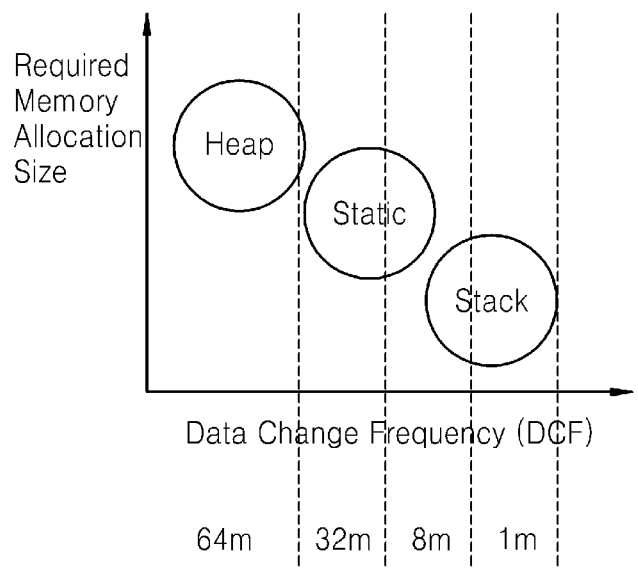
FIGS. 17A and 17B illustrate operational management of a semiconductor memory device based on a memory characteristic of each region of a cell array, according to an embodiment of the inventive concepts.
Figure 17B:
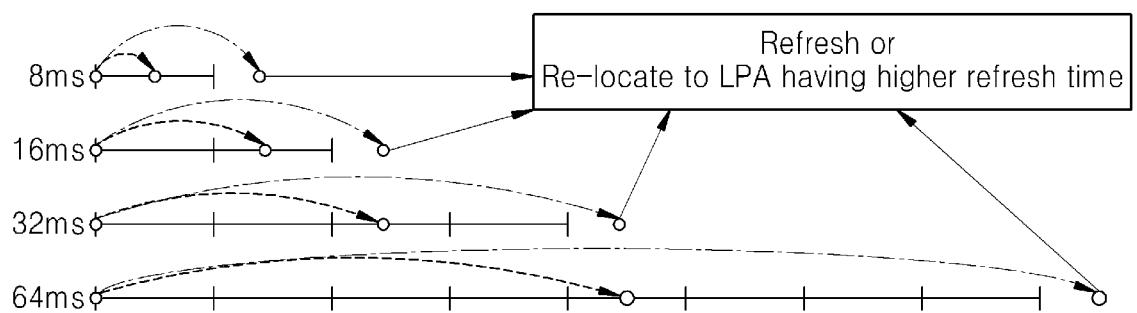

FIGS. 17A and 17B illustrate managing an operation of a semiconductor memory device based on a memory characteristic of each region of a cell array, according to an embodiment of the inventive concepts. As shown in FIG. 17A, a memory system may allocate an address in consideration of properties of data stored in the semiconductor memory device. In addition, a memory characteristic of each region of the cell array is determined by detecting at least one bit of an LPA, as described above, and data is stored in regions having different memory characteristics based on each data property. For example, an address is allocated to data in consideration of a data change frequency as data property, and a data retention characteristic of each page of the cell array is determined for the address allocation.

The cell array is divided into a plurality of regions based on data storing characteristics, e.g., a heap region in which stored data is dynamically managed, a static region in which stored data is statically managed, and a stack region in which local variables or information regarding invoke of functions are temporarily stored. The heap region has a relatively large allocation size in the cell array, and the stack region has a relatively small data change frequency of the stored data.

When a memory controller allocates addresses (e.g., LPAs) to data, the memory controller performs the allocation to increase a probability of an access, such as read/write of data of each page, before a refresh period of each region (e.g., page) of the cell array. That is, an access, such as read/write, to a corresponding page is performed before a refresh period of each page to skip a refresh operation of the corresponding page. When an access to data is not achieved for some pages before a refresh period, the memory controller refreshes the pages, and when a probability that an access to the data is not achieved for the pages before a refresh period is high even thereafter, the memory controller reallocates addresses having high data retention characteristics to the data.

FIG. 17B shows an example of a memory management operation according to a refresh period of each page and a data access. As shown in FIG. 17B, data is allocated to an address belonging to any one of groups 8 ms, 16 ms, 32 ms, and 64 ms based on a data change frequency characteristic. Thereafter, if data is accessed before a refresh period of each page, a refresh operation of each page is skipped, thereby avoiding the execution of an unnecessary refresh operation. If data is accessed after a refresh period, a refresh operation is performed at a refresh period of a corresponding page, thereby preventing a data loss. When a probability that a data access is not achieved for data allocated to an address belonging to a predetermined group before a refresh period is high even thereafter, the data may be reallocated to an address belonging to a group having a higher data retention characteristic than the predetermined group.

Figure 18:
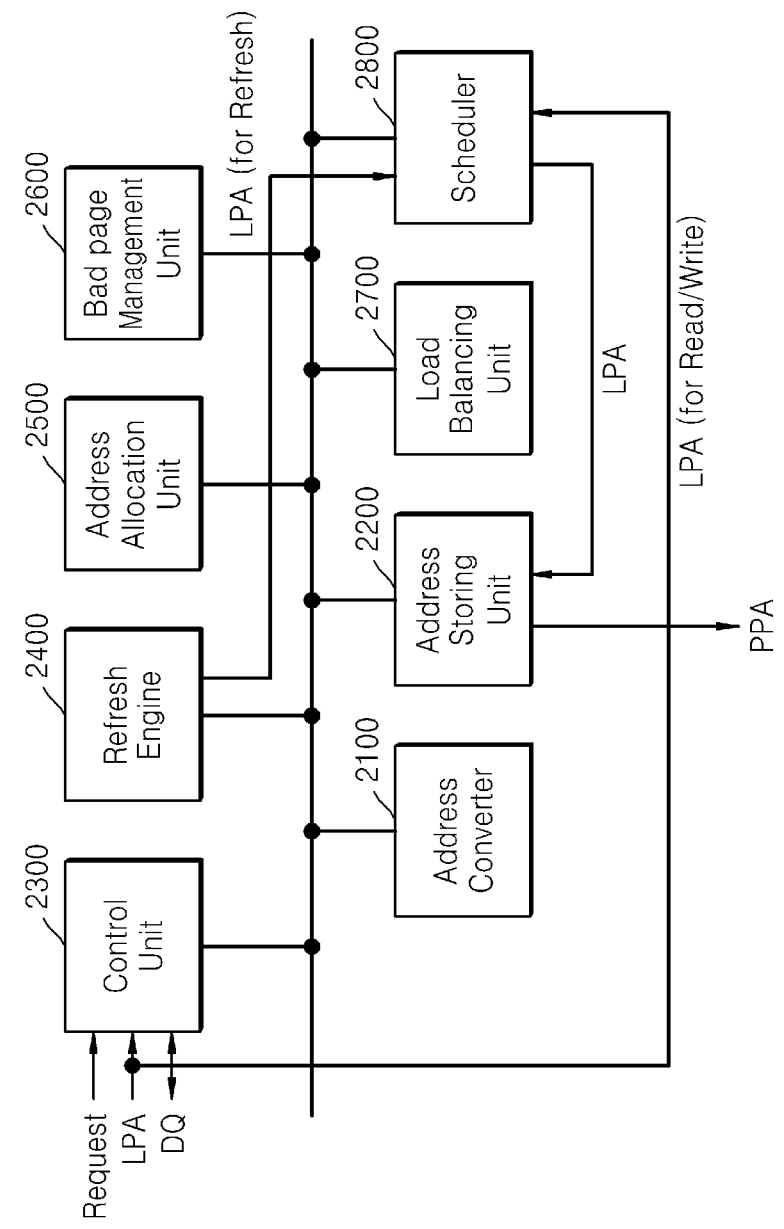
FIG. 18 is a block diagram of a memory controller according to an embodiment of the inventive concepts.

FIG. 18 is a block diagram of the memory controller 2000 of FIG. 1 or 10A according to an embodiment of the inventive concepts. As shown in FIG. 18, the memory controller 2000 may include an address storing unit 2200 for storing conversion information between LPAs of a semiconductor memory device (not shown) and PPAs, a control unit 2300 for performing a general control of a memory operation, a refresh engine 2400 for generating various signals associated with a refresh operation of the semiconductor memory device, an address allocation unit 2500 for managing address allocation to data, a bad page management unit 2600 for managing bad pages of a cell array, a load balancing unit 2700 for managing a load balance of data, and a scheduler 2800 for managing a memory operation such as read/write and refresh. In addition, when the conversion information between LPAs and PPAs is generated by the memory controller 2000, the memory controller 2000 may further include an address converter 2100.

The control unit 2300 receives a memory access request, an LPA for an access, and a data signal DQ from an external host and processes them. The address allocation unit 2500 performs an address allocation operation by referring to property of data (e.g., data change frequency characteristic) and a data retention characteristic of a corresponding page of a cell array when an address is allocated to the data, as described above. The address allocation operation may include a reallocation operation of allocating another address to data having a high probability that an access to the data allocated to a predetermined page is not achieved before a refresh period.

The refresh engine 2400 may control a refresh operation of the cell array according to the embodiments described above. For example, the refresh engine 2400 executes refresh management to determine whether data is accessed for each page, a refresh operation is skipped for pages for which a data access is achieved within a refresh period, and a refresh operation is performed for pages for which a data access has not been achieved within a refresh period. According to a result of the management, the refresh engine 2400 outputs a refresh command and an address. The address may be an LPA.

The bad page management unit 2600 detects pages in which a hard error occurs in a normal operation of the semiconductor memory device and manages not to access the bad pages. For example, a PPA of a page detected as a bad page is converted to a PPA of another remaining page so that the bad page is not accessed. In this case, the conversion information between LPAs and PPAs, which is stored in the address storing unit 2200, may vary.

The load balancing unit 2700 analyzes a work load per page of the semiconductor memory device and performs a balancing operation for maintaining a balance of the work loads in the memory system using the semiconductor memory device. For example, when an access rate of a page having a specific PPA of the cell array exceeds a threshold, the PPA is replaced by another PPA having a relatively low access rate. In this case, as described above, the conversion information between LPAs and PPAs, which is stored in the address storing unit 2200, may vary.

The scheduler 2800 may manage the provision of various signals, such as command/address, for a memory operation to a DRAM chip in consideration of a state of a cell array of the DRAM chip and a state of a bus between the DRAM chip and the memory controller 2000. In this case, an address for refresh and an address for read/write may be provided to the scheduler 2800 in a format of LPAs. The scheduler 2800 outputs an LPA for a memory operation, such as read/write or refresh, considering the various states. The LPA is converted to a PPA through the address storing unit 2200, and the PPA is provided to the DRAM chip.

FIGS. 19 to 22 are block diagrams illustrating controlling of a memory operation based on page characteristics, according to an embodiment of the inventive concepts.

Figure 19:
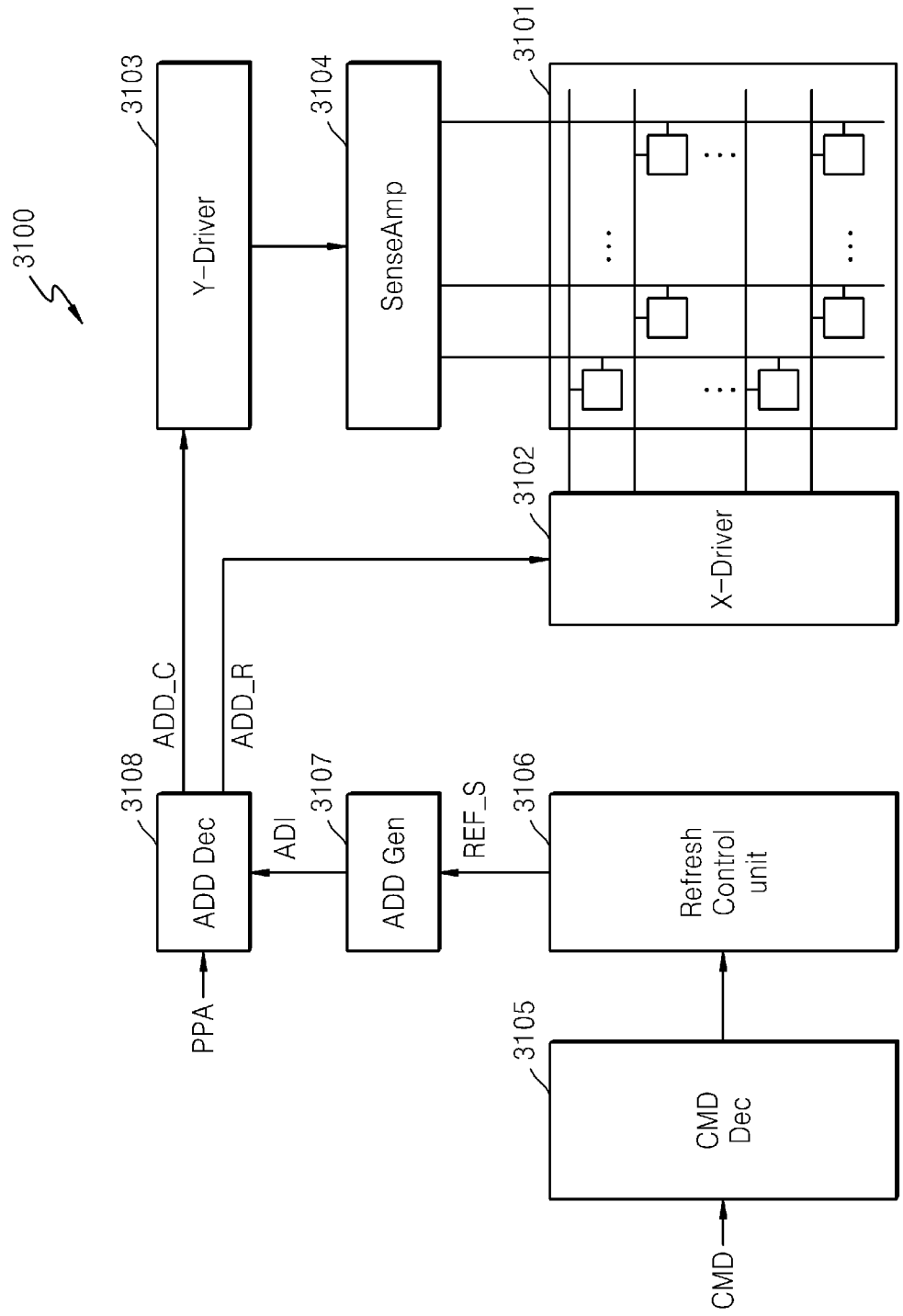
FIG. 19 is a block diagram of a semiconductor memory device according to an embodiment of the inventive concepts.

As shown in FIG. 19, a semiconductor memory device 3100 may include a cell array 3101 including a plurality of DRAM chips, a row decoder 3102, a column decoder 3103, and a sense amplifier 3104. In addition, the semiconductor memory device 3100 may include a command decoder 3105, a refresh control unit 3106, an internal address generator 3107, and an address decoder 3108 as peripheral circuits for driving the cell array 3101 or performing a refresh operation.

The command decoder 3105 generates an internal command by decoding an external command input from an external source. In a refresh operation, the refresh control unit 3106 generates a refresh signal REF_S in response to a decoding result of the command decoder 3105. The internal address generator 3107 is a component for generating an internal address ADI when the semiconductor memory device 3100 operates in a self refresh mode. That is, the internal address generator 3107 generates an internal address ADI for selecting a page to be refreshed in response to the refresh signal REF_S.

To perform a selective refresh operation based on characteristics of pages, a PPA from a memory controller (not shown) is provided to the address decoder 3108. In a normal operation, an address (not shown) for selecting a column of the cell array 3101 is further provided in addition to the PPA, and a row address ADD_R and a column address ADD_C from the address decoder 3108 are provided to the row decoder 3102 and the column decoder 3103, respectively. In a refresh operation, a row address ADD_R depending on a decoding result of the PPA is provided to the row decoder 3102.

To manage a refresh operation of the cell array 3101 per page, a command CMD and a PPA for the refresh operation are provided from the memory controller to the semiconductor memory device 3100. The memory controller determines a data retention characteristic of each page by using at least one bit of an LPA corresponding to each page and refreshes each page with a different period based on the data retention characteristic of each page. In addition, when a data access is achieved for each page within a corresponding refresh period, a refresh operation of a corresponding page may be skipped.

Figure 20:
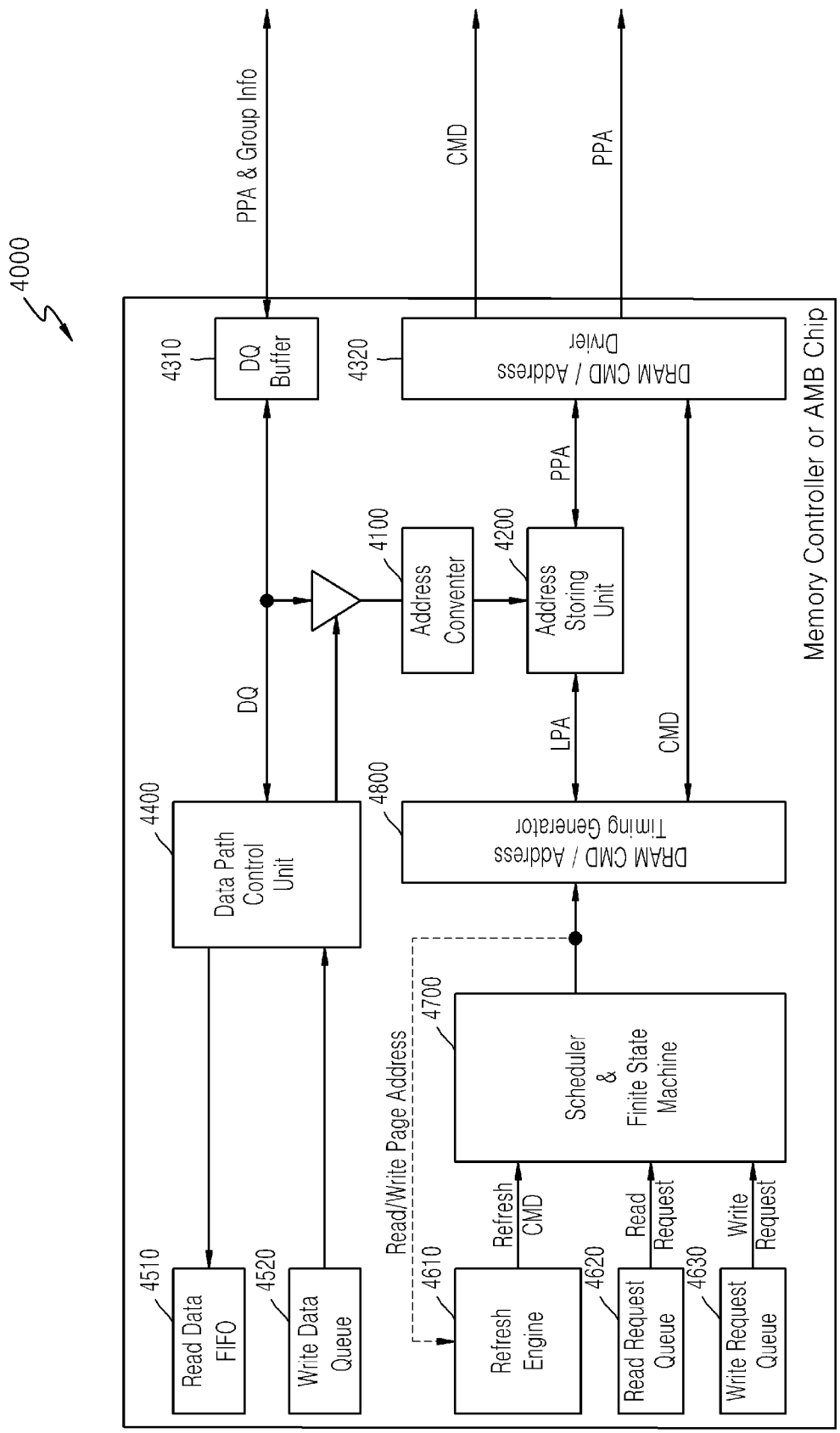
FIG. 20 is a block diagram illustrating a configuration of a memory controller according to an embodiment of the inventive concepts.

FIG. 20 is a block diagram illustrating a configuration of a memory controller 4000 according to an embodiment of the inventive concepts. As an example, in the memory controller 4000 of FIG. 20, components for controlling a refresh operation of a semiconductor memory device (not shown) are mainly shown, and the memory controller 4000 may further include components for various control operations of the semiconductor memory device.

The memory controller 4000 may include a data buffer 4310 for temporarily storing data transmitted to and received from the semiconductor memory device, a timing generator 4800 for controlling output timing of a command/address to the semiconductor memory device, a command/address driver 4320 for driving the command/address, a data path control unit 4400 for controlling an input/output path of a data signal DQ, and data storing units 4510 and 4520 for temporarily storing data transmitted to and received from an external host (not shown). In addition, the memory controller 4000 may include a refresh engine 4610 for generating a refresh command Refresh CMD for performing a refresh operation, read and write request storing units 4620 and 4630 for temporarily storing a externally input data read/write request, and a scheduler and finite state machine 4700 for managing a refresh operation according to the refresh command Refresh CMD and generating a command associated with read/write. The scheduler and finite state machine 4700 may be a component including at least one state machine in addition to the scheduler 2800 shown in FIG. 18. Alternatively, the scheduler 2800 shown in FIG. 18 may further include the at least one state machine shown in FIG. 20.

The memory controller 4000 may further include an address storing unit 4200 for storing conversion information between LPAs and PPAs of a cell array of the semiconductor memory device. Like the embodiments described above, the address storing unit 4200 may use the LPAs as addresses of the address storing unit 4200 and store the PPAs corresponding to the LPAs.

An address converter 4100 shown in FIG. 20 may be included in the memory controller 4000 when an address conversion operation between an LPA and a PPA is performed in the memory controller 4000. That is, a memory system (not shown) is operated, a PPA and group information Group Info are provided from the semiconductor memory device to the memory controller 4000, and the address converter 4100 performs the address conversion operation based on the PPA and the group information Group Info.

The refresh engine 4610 generates a refresh command Refresh CMD for performing a refresh operation of the cell array of the semiconductor memory device according to a predetermined refresh period. The refresh engine 4610 generates a refresh command Refresh CMD according to a refresh period of a page of the cell array and provides the refresh command Refresh CMD to the scheduler and finite state machine 4700. In addition, address information Read/Write Page Address of a page for which an access, such as read/write, has been achieved is provided to the refresh engine 4610, and the refresh engine 4610 controls the refresh operation by further referring to the address information Read/Write Page Address of the page for which an access has been achieved.

The scheduler and finite state machine 4700 generates a command and an address for a selective refresh operation of a page of the cell array in response to a refresh command Refresh CMD. The generated address may be an LPA, and the generated LPA is converted to a PPA by referring to the conversion information stored in the address storing unit 4200. The PPA is provided to the semiconductor memory device via the command/address driver 4320.

In a normal operation, a read/write request is provided to the scheduler and finite state machine 4700, and the scheduler and finite state machine 4700 generates a command and an address for a read/write operation of the semiconductor memory device. The address for the read/write operation may also be an LPA, and the generated LPA is converted to a PPA by referring to the conversion information stored in the address storing unit 4200.

Figure 21A:
FIGS. 21A, 21B, and 21C show a block diagram illustrating a refresh control operation of the memory controller of FIG. 20, according to an embodiment of the inventive concepts.
Figure 21B:
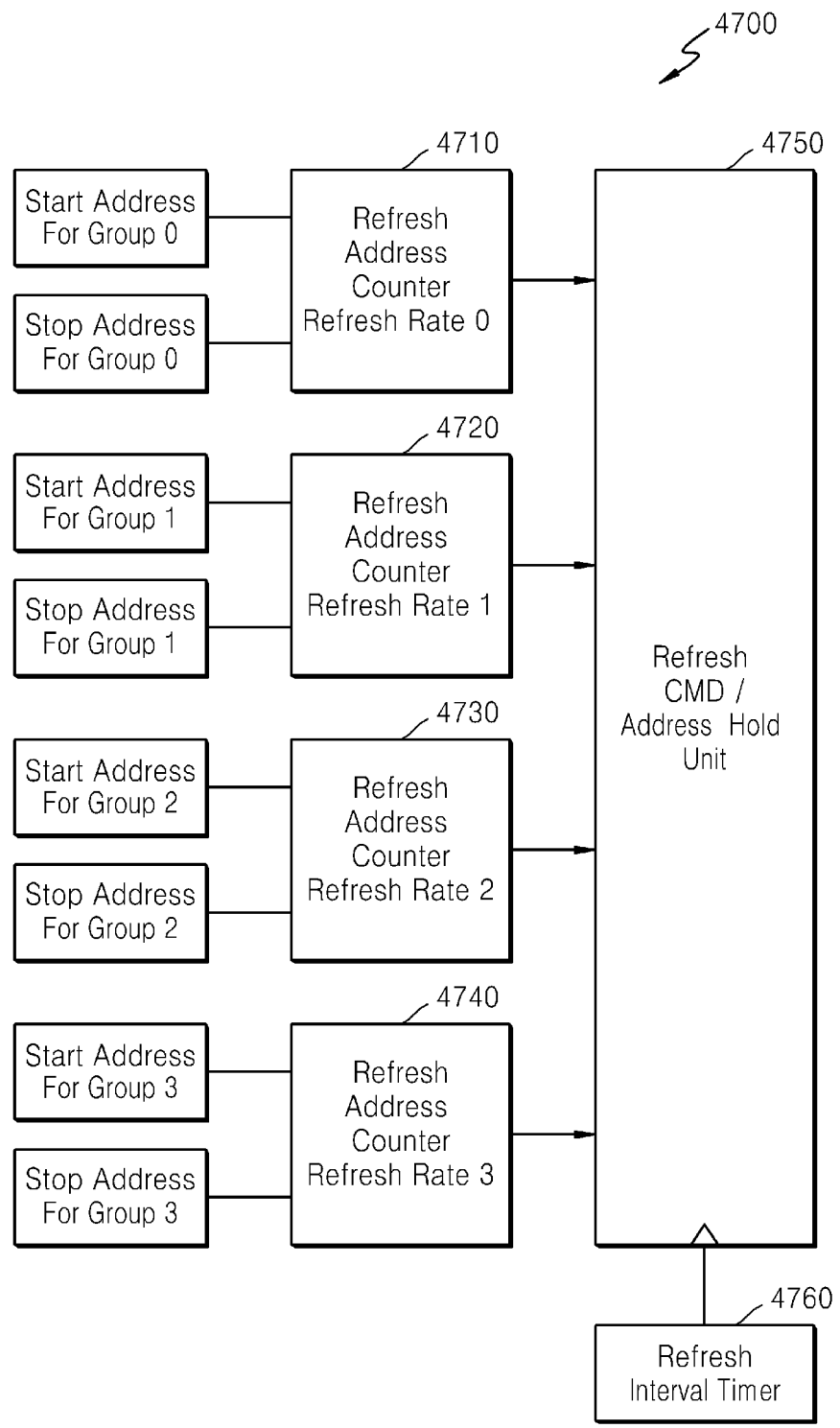
Figure 21C:
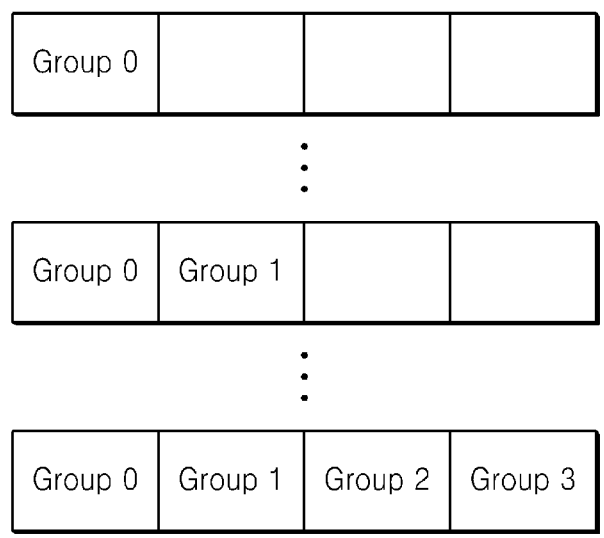

FIGS. 21A, 21B, and 21C show a block diagram illustrating a refresh control operation of the memory controller 4000 of FIG. 20, according to an embodiment of the inventive concepts. An example of a refresh control operation of the memory controller 4000 is described with reference to FIGS. 20, 21A, 21B, and 21C.

The memory controller 4000 may determine a data retention characteristic of each page of the semiconductor memory device by referring to the group information Group Info or the LPAs. The memory controller 4000 manages a refresh operation of each page based on the determined data retention characteristics.

As shown in FIG. 21A, the PPAs are sorted based on the group information Group Info. For example, PPAs having relatively short data retention characteristics are sequentially sorted. According to a sorting result of the PPAs, a mapping operation between the LPAs and the PPAs. For example, the mapping operation is performed by increasing a value of an LPA by 1 in an order of the sorted PPAs. According to a mapping result, data retention characteristics of pages having the PPAs corresponding to the LPAs may be determined using values of the LPAs.

FIG. 21B is a block diagram illustrating an implementation example of the scheduler and finite state machine 4700, showing an example in which a refresh address is generated using a mapped LPA. When the LPAs are classified into 4 groups based on the data retention characteristics, the scheduler and finite state machine 4700 includes first to fourth address counters 4710 to 4740 for generating LPAs belonging to each corresponding group. Information indicating a start address and information indicating an end address of each corresponding group are provided to each of the first to fourth address counters 4710 to 4740.

A refresh command/address hold unit 4750 receives addresses (e.g., LPAs of each corresponding group) from each of the first to fourth address counters 4710 to 4740 and holds the received addresses. In addition, the refresh command/address hold unit 4750 receives a refresh command Refresh CMD from the refresh engine 4610 shown in FIG. 20 and holds the received refresh command Refresh CMD. A refresh interval timer 4760 provides a control signal for controlling output timing of the refresh command Refresh CMD and the LPAs to the refresh command/address hold unit 4750.

FIG. 21C shows an example of refresh commands Refresh CMD and addresses generated by the memory controller 4000. As shown in FIG. 21C, pages belonging to first to fourth groups Group 0 to Group 3 are refreshed according to different refresh periods. For example, pages belonging to the first group Group 0 have the shortest relative refresh period, and pages belonging to the fourth group Group 3 have the longest relative refresh period. The refresh command/address hold unit 4750 selectively outputs addresses from the first to fourth address counters 4710 to 4740 according to the refresh periods of the first to fourth groups Group 0 to Group 3. An address output from the refresh command/address hold unit 4750 may be an LPA, and the LPA is converted to a PPA by the memory controller 4000 and provided to a semiconductor memory device (not shown).

Figures 22, 23:
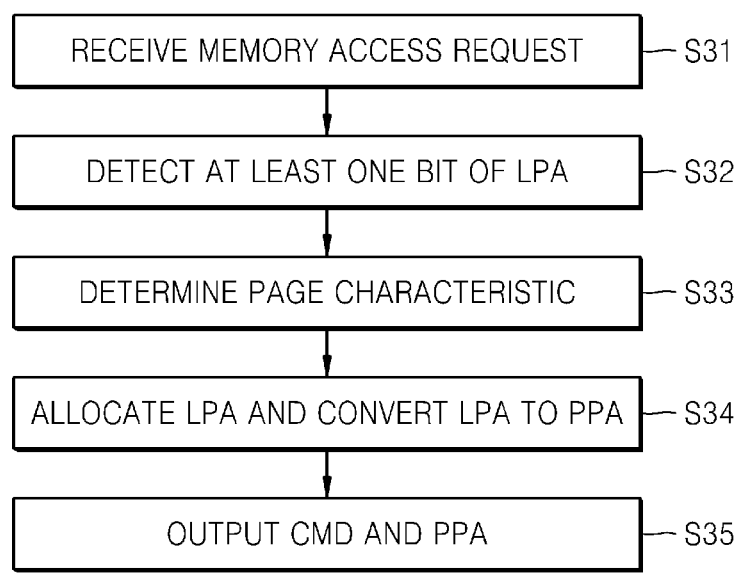
FIG. 22 illustrates the performance of bad page management and load balancing in a memory controller according to an embodiment of the inventive concepts.
FIG. 23 is a flowchart illustrating an operating method of a memory system, according to another embodiment of the inventive concepts.

FIG. 22 illustrates performing bad page management and load balancing in a memory controller according to an embodiment of the inventive concepts. As shown in FIG. 22, when a page having a predetermined PPA is detected as a bad page, the bad page may be managed by replacing the bad page by a remaining page. For example, when a page having a PPA of "0000000101" is a bad page, the PPA of "0000000101" is replaced by a PPA, e.g., "0000000000", of a remaining page. As a result of this replacement operation, the PPA of the bad page is remapped to an LPA having the largest value (e.g., "1111111111"). By managing that the LPA having "1111111111" exceeds an accessible address range, an access to the bad page is prevented.

An operation related to load balancing may also be performed in a method as shown in FIG. 22. Whether an access rate of a page of a specific PPA (e.g., a PPA of "0000000101") exceeds a predetermined threshold may be determined, and the PPA of the page may be replaced by another value according to a result of the determination. For example, if an access rate of the page of the PPA of "0000000101" exceeds the threshold, the PPA of "0000000101" is replaced by a PPA of "0000000000" having a relatively low access rate. Due to this operation, frequent updating of only a specific region of a cell array is reduced.

FIG. 23 is a flowchart illustrating an operating method of a memory system, according to another embodiment of the inventive concepts. FIG. 23 shows an example in which a memory controller manages a memory operation per region (e.g., page) of a cell array.

In operation S31, a request for an access to data a semiconductor memory device is received from an external host. The memory controller receives an LPA from the semiconductor memory device and stores the LPA, or receives group information and a PPA from the semiconductor memory device and generates and stores an LPA based on the group information and the PPA as described above. For the memory operation, at least one of bits forming the LPA is detected in operation S32, and as a result of the detection, a characteristic of a page (e.g., memory characteristic, such as a data retention characteristic, of the page) corresponding to the LPA is determined in operation S33.

A data access operation, such as data read/write, or a refresh operation of a cell array of the semiconductor memory device is managed per page in association with the memory operation. For example, for a data read/write operation, an LPA is allocated to data, or an LPA for which the refresh operation is performed is allocated. In the data read/write operation, an operation of allocating an LPA to the data may be performed by referring to a data change frequency and a data retention characteristic of each page. In addition, in the refresh operation, different pages are selected and refreshed at every refresh period based on data retention characteristics pages, and accordingly, an LPA of a page to be actually refreshed is allocated at every refresh period. The allocated LPA is converted to a PPA based on address conversion information in operation S34.

A command and a PPA for controlling the memory operation per region of the cell array are output from the memory controller in operation S35. The output command and PPA are provided to the semiconductor memory device to control the memory operation of a corresponding page.

Figure 24:
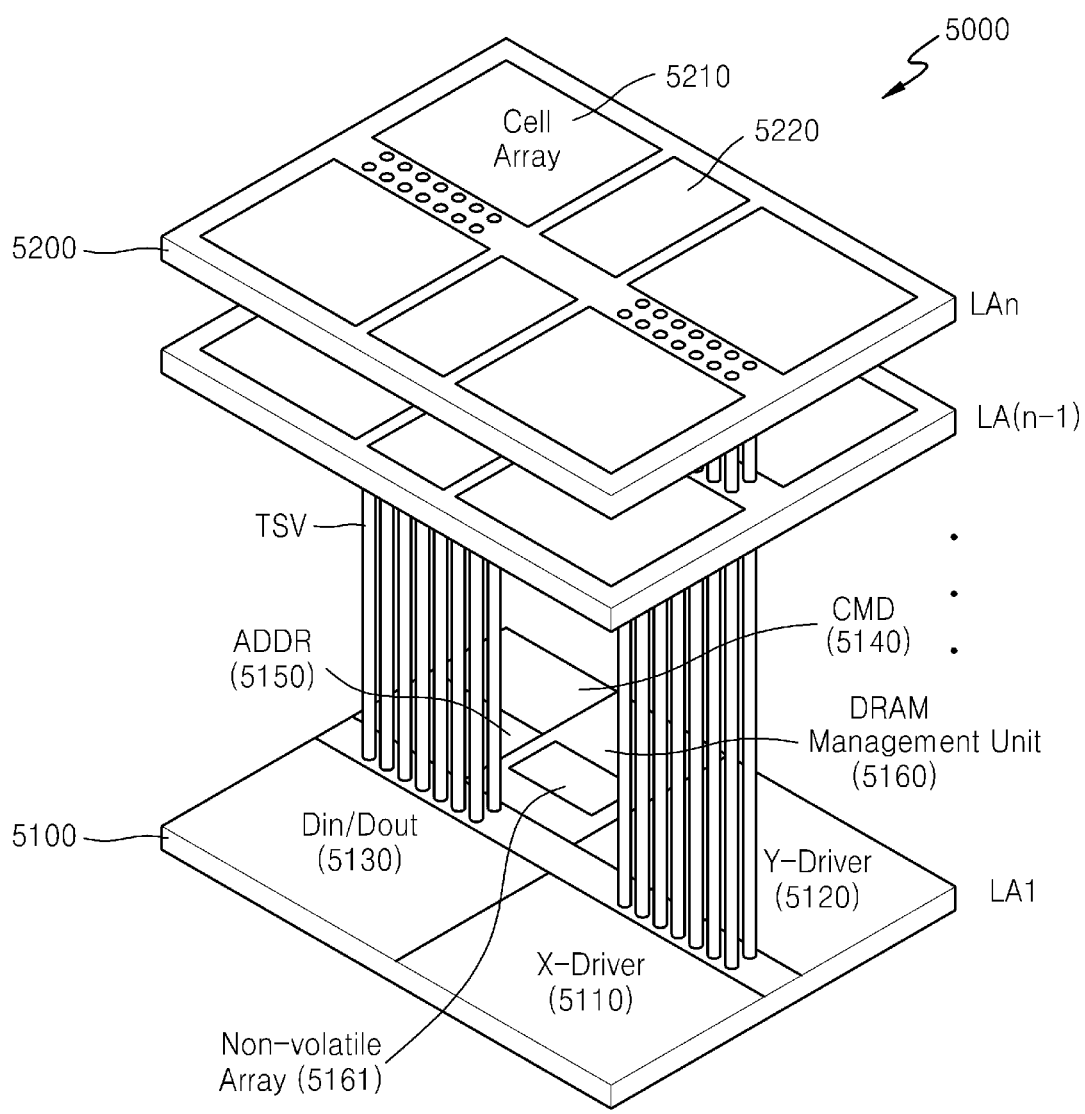
FIG. 24 is a structural diagram of a semiconductor memory device according to another embodiment of the inventive concepts.

FIG. 24 is a structural diagram of a semiconductor memory device 5000 according to another embodiment of the inventive concepts. FIG. 24 shows an example in which the semiconductor memory device 5000 is implemented by stacking first to nth semiconductor layers LA1 to LAn.

As shown in FIG. 24, the semiconductor memory device 5000 may include the first to nth semiconductor layers LA1 5100 to LAn 5200. Each of the first to nth semiconductor layers LA1 5100 to LAn 5200 may be a memory chip including a DRAM cell, or some of the first to nth semiconductor layers LA1 5100 to LAn 5200 may be master chips for interfacing with an external controller and the remaining semiconductor layers may be slave chips for storing data. In the example of FIG. 24, the first semiconductor layer LA1 5100 located at the bottom is assumed as a master chip, and the remaining semiconductor layers LA2 to LAn 5200 are assumed as slave chips.

The first to nth semiconductor layers LA1 5100 to LAn 5200 transmit and receive signals to and from each other via a Through Silicon Via (TSV), and the master chip, namely, the first semiconductor layer LA1 5100, communicates with an external memory controller (not shown) via a conductive means (not shown) formed on an outer surface thereof. A configuration and operation of the semiconductor memory device 5000 are described below based on the first semiconductor layer LA1 5100 as a master chip and the nth semiconductor layer LAn 5200 as a slave chip.

The first semiconductor layer LA1 5100 includes various circuits for driving a cell array 5210 included in the slave chip, namely, the nth semiconductor layer LAn 5200. For example, the first semiconductor layer LA1 5100 may include a row driver X-Driver 5110 for driving a wordline of the cell array 5210, a column driver Y-Driver 5120 for driving a bitline of the cell array 5210, a data input/output unit 5130 for controlling an input/output of data, a command buffer 5140 for receiving an externally supplied command CMD, and an address buffer 5150 for receiving an externally supplied address and buffering the received address.

The first semiconductor layer LA1 5100 may further include a DRAM management unit 5160 for managing a memory operation of the slave chip, namely, the nth semiconductor layer LAn 5200. The DRAM management unit 5160 may include a nonvolatile array 5161 for storing group information and/or address conversion information between PPAs and LPAs, which are associated with memory characteristics of regions in the cell array 5210, as described in the above described embodiments. The group information and/or address conversion information may be provided to the external memory controller in an initial operation of a memory system.

The nth semiconductor layer LAn 5200 may include the cell array 5210 and a peri region 5220 in which other peripheral circuits, e.g., a row/column selector for selecting a row and column of the cell array 5210 and a sense amplifier (not shown), are arranged.

According to the embodiment shown in FIG. 24, the information associated with the memory characteristics of the cell array 5210 may be stored in the nonvolatile array 5161, and in an operation of the memory system, the group information and/or address conversion information may be provided to the external memory controller or host. The external memory controller or host generates LPAs by receiving the group information from the semiconductor memory device 5000 or directly receives LPAs from the semiconductor memory device 5000. The memory characteristics of the regions in the cell array 5210 are determined by referring to at least one bit of each of the generated or received LPAs, and a memory operation per region of the cell array 5210 is managed according to a result of the determination.

Alternatively, the first semiconductor layer LA1 5100 as a master chip may manage the memory operation per region of the cell array 5210. Various control circuits for managing the memory operation per region of the cell array 5210 may be included in the DRAM management unit 5160. For example, all or some of the components for memory management, which are shown in FIG. 18, may be included in the DRAM management unit 5160. The DRAM management unit 5160 allocates an address to data by referring to at least one bit of an LPA, converts the LPA to a PPA by referring to the address conversion information stored in the nonvolatile array 5161, and outputs the PPA to the slave chip LAn 5200.

Figure 25:
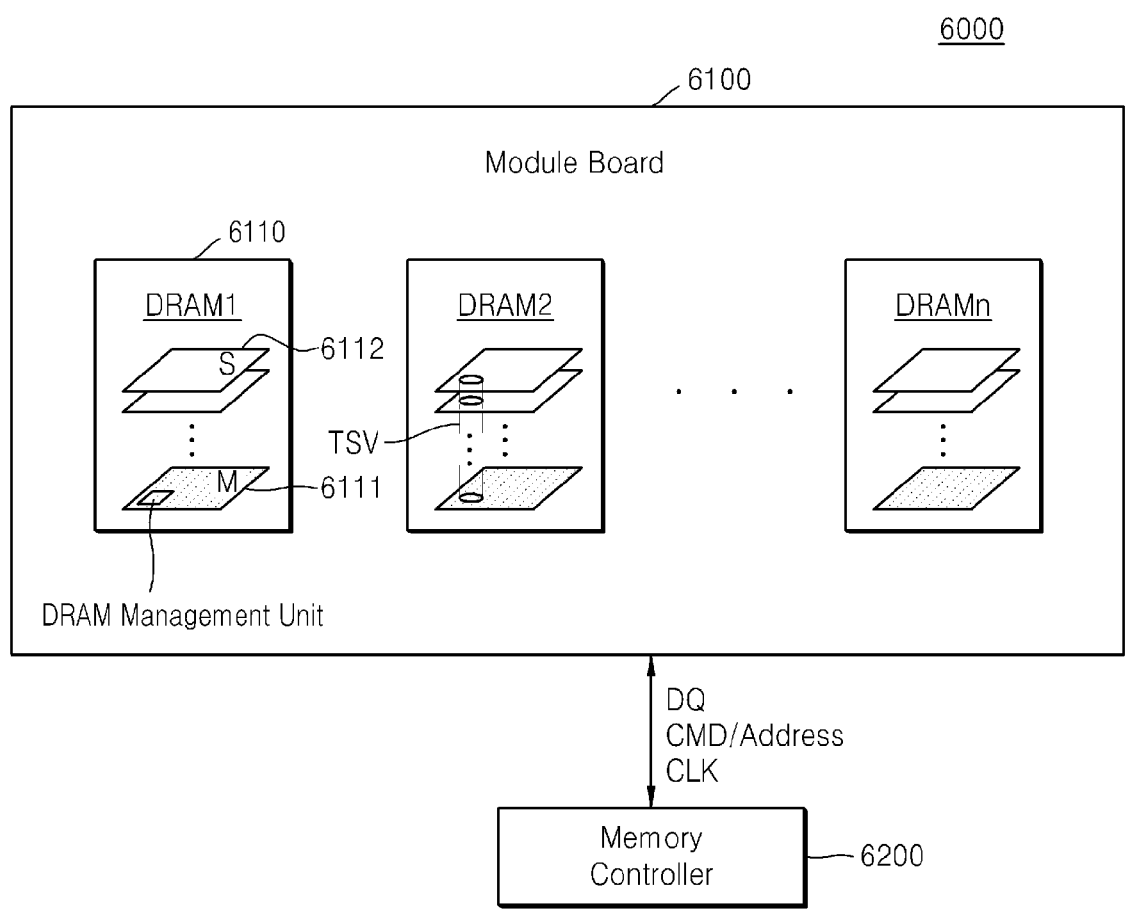
FIG. 25 illustrates a memory system to which the semiconductor memory device of FIG. 24 may be applied, according to an embodiment of the inventive concepts.

FIG. 25 illustrates a memory system 6000 to which the semiconductor memory device 5000 of FIG. 24 is applied, according to an embodiment of the inventive concepts. As shown in FIG. 25, the memory system 6000 includes a memory module 6100 and a memory controller 6200. The memory module 6100 includes at least one semiconductor memory device 6110 assembled on a module board. The at least one semiconductor memory device 6110 may be implemented by a DRAM chip, and each of the at least one semiconductor memory device 6110 includes a plurality of semiconductor layers. The plurality of semiconductor layers includes at least one master chip 6111 and at least one slave chip 6112. In addition, as described above, each of the at least one master chip 6111 may include a DRAM management unit having a nonvolatile array for storing group information and/or address conversion information generated according to an embodiment of the inventive concepts. A signal transfer between the plurality of semiconductor layers may be performed via a TSV. The memory module 6100 communicates with the memory controller 6200 via a system bus, and accordingly, data DQ, a command/address CMD/Add, and a clock signal CLK are transmitted and received between the memory module 6100 and the memory controller 6200.

According to the memory module 6100 shown in FIG. 25, it is unnecessary that a separate chip for managing a memory operation is assembled on the module board. That is, some of the plurality of semiconductor layers in the each of the at least one semiconductor memory device 6110 operate as a master chip, and a management unit for memory management is arranged in the master chip. Accordingly, a degree of integration may increase in terms of the memory module 6100.

Figure 26:
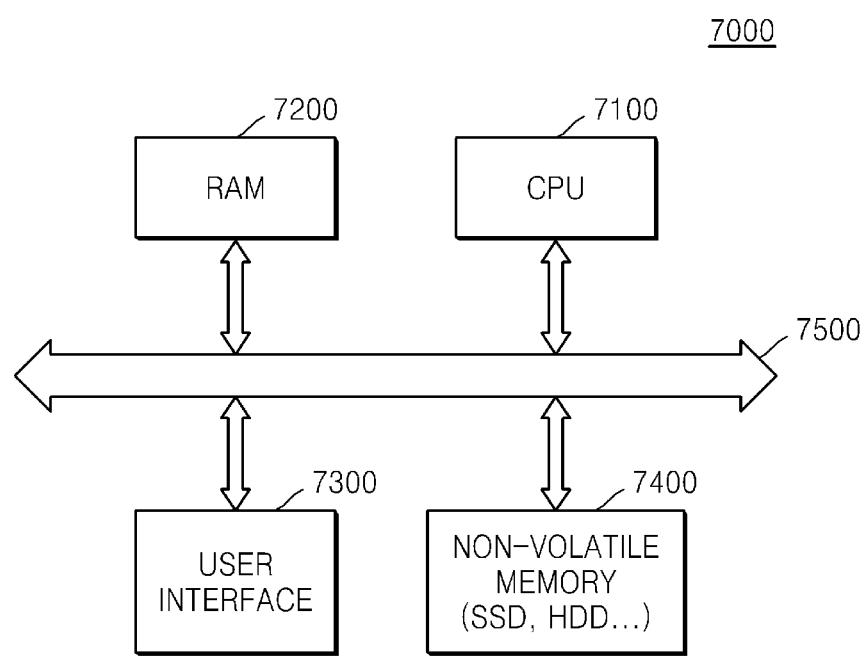
FIG. 26 is a block diagram of a computing system equipped with a memory system according to an embodiment of the inventive concepts.

FIG. 26 is a block diagram of a computing system 7000 equipped with a memory system according to an embodiment of the inventive concepts. A semiconductor memory device according to an embodiment of the inventive concepts may be installed as a RAM 7200 in the computing system 7000 such as a mobile device or a desktop computer. Any one of the embodiments described above may be applied to the semiconductor memory device installed as the RAM 7200. For example, any one semiconductor memory device according to the above described embodiments of the inventive concepts may be applied to the RAM 7200, or the RAM 7200 may be in a memory module form. Alternatively, the RAM 7200 may include a semiconductor memory device and a memory controller.

The computing system 7000 includes a Central Processing Unit (CPU) 7100, the RAM 7200, a user interface 7300, and a nonvolatile memory 7400, which are electrically connected to a bus 7500. The nonvolatile memory 7400 may be a large capacity storage device, such as a Solid State Disk (SSD) or a Hard Disk Drive (HDD).

In the computing system 7000, like the embodiments described above, the RAM 7200 may include a DRAM chip having a cell array for storing data and a memory management chip for performing a management operation based on memory characteristics.

According to this configuration, various kinds of information for management per region of the cell array, e.g., group information and address conversion information in the above described embodiments, are stored in the RAM 7200, and various components for managing a memory operation based on the information are included in the RAM 7200. Since the components for the management per region are integrated in the memory management chip, a general-use characteristic of the DRAM chip may not decrease, and memory operation performance may increase.

While the inventive concepts has been particularly shown and described with reference to exemplary embodiments thereof, it will be understood that various changes in form and details may be made therein without departing from the spirit and scope of the following claims.

What is claimed is:

1. A semiconductor memory device comprising:
   a cell array including a plurality of regions accessed by first addresses, the plurality of regions including at least two groups of regions having respectively different memory characteristics; and
   a nonvolatile array for nonvolatile storage of group information indicative of which of the least two groups each of the plurality of regions belongs.

2. The semiconductor memory device of claim 1, wherein the group information is sequentially stored in the nonvolatile array according to first address values of the plurality of regions.

3. The semiconductor memory device of claim 1, wherein the plurality of regions of the cell array are respective pages selectively accessed in response to the first addresses.

4. The semiconductor memory device of claim 1, wherein the memory characteristics are data retention characteristics of the plurality of regions.

5. The semiconductor memory device of claim 1, wherein the nonvolatile array is implemented by one of an anti-fuse array and a fuse array.

6. The semiconductor memory device of claim 1, wherein the cell array comprises a Dynamic Random Access Memory (DRAM) cell.

7. The semiconductor memory device of claim 1, wherein in an initial operation, the group information is provided to an external controller, and a memory operation of each region is controlled in accordance with the group information.

8. The semiconductor memory device of claim 1, wherein the nonvolatile array further stores conversion information for conversion of the first addresses to second addresses based on the group information.

9. The semiconductor memory device of claim 8, wherein at least one bit of each of the second addresses comprises the group information indicative of the group to which each region belongs.

10. The semiconductor memory device of claim 8, wherein the second addresses are converted so that a group to which each region belongs is determined based on address values of the second addresses.

11. The semiconductor memory device of claim 8, wherein the nonvolatile array comprises an array-type nonvolatile cell having a plurality of rows, and a first address corresponding to a second address is stored in a row selected by the second address as the conversion information.

12. The semiconductor memory device of claim 11, further comprising a decoder for externally receiving the second addresses and decoding the second addresses,
wherein the nonvolatile array outputs the first address stored in the row corresponding to the second address.

13. The semiconductor memory device of claim 1, wherein the cell array is a Dynamic Random Access Memory (DRAM) cell array, and the memory characteristics are respective data retention ranges of the plurality of regions of the DRAM cell array.

14. A semiconductor memory device comprising:
a cell array including a plurality of regions;
a nonvolatile array for nonvolatile storage of conversion information for conversion of first addresses denoting physical addresses of the plurality of regions to second addresses based on memory characteristics of the plurality of regions; and
a decoder for accessing the nonvolatile array in response to a signal from an external device.

15. The semiconductor memory device of claim 14, wherein the nonvolatile array stores the first addresses corresponding to the second addresses as the conversion information in locations accessed by the second addresses.

16. The semiconductor memory device of claim 15, wherein the decoder receives the second addresses from the external device, and
the plurality of regions of the cell array are accessed by the first addresses output from the nonvolatile array.

17. The semiconductor memory device of claim 14, wherein the conversion information between the first addresses and the second addresses is provided to the external device in an initial operation.

18. The semiconductor memory device of claim 14, wherein the conversion information between the first addresses and the second addresses is stored during a test operation of the semiconductor memory device.

19. The semiconductor memory device of claim 14, wherein at least one bit of each of the second addresses comprises information associated with a memory characteristic of each corresponding one of the plurality of regions.

20. A memory module comprising:
a module board;
at least one memory chip, which is assembled on the module board and includes a cell array having a plurality of regions, the plurality of regions including at least two groups of regions having respectively different memory characteristics; and
a memory management chip, which is assembled on the module board, manages a memory operation of the at least one memory chip, and comprises a nonvolatile array for nonvolatile storage of group information indicative of which of the least two groups each of the plurality of regions belongs.

21. The memory module of claim 20, wherein the plurality of regions of the cell array are respective pages selectively accessed in response to first addresses, and the group information has values according to data retention characteristics of the plurality of pages.

22. The memory module of claim 20, wherein the nonvolatile array further stores conversion information for conversion of first addresses to second addresses based on the group information.

23. The memory module of claim 22, wherein the memory management chip is an Advanced Memory Buffer (AMB) chip for externally receiving a packet, the packet including commands and the second addresses.

24. The memory module of claim 23, wherein the AMB chip comprises:
an AMB core for storing the externally received packet;
a path control logic for controlling a transfer path of the packet; and
a memory management unit including the nonvolatile array and converting the second addresses included in the packet to the first addresses.

25. A memory controller for communicating with a semiconductor memory device including a cell array having a plurality of regions, the plurality of regions including at least two groups of regions having respectively different memory characteristics, the memory controller comprising:
an address converter for receiving group information indicative of which of the at least two groups each of the plurality of region belongs, and converting a first address indicative of a physical address of each of the plurality of regions to a second address based on the group information; and
an address storing unit for storing conversion information for the conversion of addresses.

26. The memory controller of claim 25, wherein the address storing unit stores first addresses corresponding to second addresses in locations designated by the second addresses.

27. The memory controller of claim 26, wherein the second addresses are received from an external host, converted to first addresses, and provided to the semiconductor memory device.

28. The memory controller of claim 25, wherein, in a memory operation, at least one bit of each of the second addresses is checked, and a second address corresponding to a region to be accessed is selected according to a result of the checking.

29. A memory controller for communicating with a semiconductor memory device including a cell array having a plurality of regions, the memory controller comprising:
an address storing unit for storing conversion information for conversion of first addresses indicating physical addresses of the plurality of regions to second addresses based on memory characteristics of the plurality of regions; and
a decoder for receiving a second address from a host and accessing the address storing unit by decoding the second address,
wherein a first address corresponding to the second address from the host is output to the semiconductor memory device.

30. The memory controller of claim 29, wherein the conversion information is provided from the semiconductor memory device when a system is operated.

\* \* \* \* \*